United States Patent
Gyoten et al.

(10) Patent No.: US 7,505,352 B2
(45) Date of Patent: Mar. 17, 2009

(54) PARALLEL OPERATIONAL PROCESSING DEVICE

(75) Inventors: Takayuki Gyoten, Tokyo (JP); Katsumi Dosaka, Tokyo (JP); Hideyuki Noda, Tokyo (JP); Tetsushi Tanizaki, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 223 days.

(21) Appl. No.: 11/698,188

(22) Filed: Jan. 26, 2007

(65) Prior Publication Data

US 2007/0180006 A1    Aug. 2, 2007

(30) Foreign Application Priority Data

Jan. 31, 2006   (JP)   ............................. 2006-023054

(51) Int. Cl.
*G11C 8/00*     (2006.01)
*G11C 5/06*     (2006.01)
*G11C 7/00*     (2006.01)

(52) U.S. Cl. ...................... 365/230.03; 365/63; 365/200
(58) Field of Classification Search ................... 365/63, 365/200, 230.03

See application file for complete search history.

(56) References Cited

U.S. PATENT DOCUMENTS

| | | | | |
|---|---|---|---|---|
| 5,691,933 A | * | 11/1997 | Takenaka | 365/63 |
| 5,761,149 A | * | 6/1998 | Suzuki et al. | 365/230.03 |
| 6,975,552 B2 | * | 12/2005 | Kim | 365/230.03 |
| 2006/0163634 A1 | * | 7/2006 | Ohsawa | 257/296 |
| 2008/0002488 A1 | * | 1/2008 | Hasegawa et al. | 365/200 |

FOREIGN PATENT DOCUMENTS

JP    2003-186854 A    7/2003

* cited by examiner

*Primary Examiner*—Ly D Pham
(74) *Attorney, Agent, or Firm*—Buchanan Ingersoll & Rooney PC

(57) ABSTRACT

In a parallel operational processing device having an operational processing unit arranged between memory blocks each having a plurality of memory cells arranged in rows and columns, the respective columns of each memory block are alternately connected to the operational processing units on the opposite sides of the memory block. By selecting one word line in one memory block, data can be transferred to two operational processing units. The number of the word lines selected per one operational processing unit is reduced, and power consumption is reduced. The bit operation units and sense amplifiers/write drivers of the operational processing units have arrangement pitch conditions mitigated and are reduced in number, and an isolation region between the memory blocks is not required and the layout area is reduced. Thus, the parallel operational processing device with a layout area and the power consumption reduced, can achieve a fast operation.

6 Claims, 14 Drawing Sheets

FIG.4

CIRCUITS SHARED BY MATS

| 55A | 50 | 60a | | 60b | 55B |
|---|---|---|---|---|---|
| | GLOBAL BUS INTERFACE | | | GLOBAL BUS INTERFACE | |
| | MEMORY BLOCK MA0 | SRAM PERIPHERAL CIRCUIT | SH0 | MEMORY BLOCK | MB0 |
| | SENSE AMPLIFIER/WRITE DRIVER BAND TXA0 | | | SENSE AMPLIFIER/WRITE DRIVER BAND | TXB0 |
| | OPERATIONAL PROCESSING UNIT PA0 | LOCAL CONTROL CIRCUIT | LK0 | OPERATIONAL PROCESSING UNIT | PB0 |
| | SENSE AMPLIFIER/WRITE DRIVER BAND TXA1 | SRAM PERIPHERAL CIRCUIT | | SENSE AMPLIFIER/WRITE DRIVER BAND | TXB1 |
| | MEMORY BLOCK MA1 | | SH1 | MEMORY BLOCK | MB1 |
| | SENSE AMPLIFIER/WRITE DRIVER BAND TXA2 | | | SENSE AMPLIFIER/WRITE DRIVER BAND | TXB2 |
| | OPERATIONAL PROCESSING UNIT PA1 | LOCAL CONTROL CIRCUIT | LK1 | OPERATIONAL PROCESSING UNIT | PB1 |
| | SENSE AMPLIFIER/WRITE DRIVER BAND TXA3 | SRAM PERIPHERAL CIRCUIT | | SENSE AMPLIFIER/WRITE DRIVER BAND | TXB3 |
| | MEMORY BLOCK MA2 | | SH2 | MEMORY BLOCK | MB2 |
| | SENSE AMPLIFIER/WRITE DRIVER BAND TXA4 | | | SENSE AMPLIFIER/WRITE DRIVER BAND | TXB4 |
| | OPERATIONAL PROCESSING UNIT PA2 | LOCAL CONTROL CIRCUIT | LK2 | OPERATIONAL PROCESSING UNIT | PB2 |
| | SENSE AMPLIFIER/WRITE DRIVER BAND TXA5 | SRAM PERIPHERAL CIRCUIT | | SENSE AMPLIFIER/WRITE DRIVER BAND | TXB5 |
| | MEMORY BLOCK MA3 | | SH3 | MEMORY BLOCK | MB3 |
| | SENSE AMPLIFIER/WRITE DRIVER BAND TXA6 | | | SENSE AMPLIFIER/WRITE DRIVER BAND | TXB6 |
| | ⋮ | | | ⋮ | |
| | SENSE AMPLIFIER/WRITE DRIVER BAND TXAk-7 | SRAM PERIPHERAL CIRCUIT | | SENSE AMPLIFIER/WRITE DRIVER BAND | TXBk-7 |
| | MEMORY BLOCK MAm-3 | | SHm-3 | MEMORY BLOCK | MBm-3 |
| | SENSE AMPLIFIER/WRITE DRIVER BAND TXAk-6 | | | SENSE AMPLIFIER/WRITE DRIVER BAND | TXBk-6 |
| | PAm-3 OPERATIONAL PROCESSING UNIT LKm-3 | LOCAL CONTROL CIRCUIT | | OPERATIONAL PROCESSING UNIT | PBm-3 |
| | SENSE AMPLIFIER/WRITE DRIVER BAND TXAk-5 | SRAM PERIPHERAL CIRCUIT | | SENSE AMPLIFIER/WRITE DRIVER BAND | TXBk-5 |
| | MEMORY BLOCK MAm-2 | | SHm-2 | MEMORY BLOCK | MBm-2 |
| | SENSE AMPLIFIER/WRITE DRIVER BAND TXAk-4 | | | SENSE AMPLIFIER/WRITE DRIVER BAND | TXBk-4 |
| | PAm-2 OPERATIONAL PROCESSING UNIT LKm-2 | LOCAL CONTROL CIRCUIT | | OPERATIONAL PROCESSING UNIT | PBm-2 |
| | SENSE AMPLIFIER/WRITE DRIVER BAND TXAk-3 | SRAM PERIPHERAL CIRCUIT | | SENSE AMPLIFIER/WRITE DRIVER BAND | TXBk-3 |
| | MEMORY BLOCK MAm-1 | | SHm-1 | MEMORY BLOCK | MBm-1 |
| | SENSE AMPLIFIER/WRITE DRIVER BAND TXAk-2 | | | SENSE AMPLIFIER/WRITE DRIVER BAND | TXBk-2 |
| | PAm-1 OPERATIONAL PROCESSING UNIT LKm-1 | LOCAL CONTROL CIRCUIT | | OPERATIONAL PROCESSING UNIT | PBm-1 |
| | SA/WD(CPB4) TXAk-1 | SRAM PERIPHERAL CIRCUIT | | SENSE AMPLIFIER/WRITE DRIVER BAND | TXBk-1 |
| | MEMORY BLOCK MAm | | SHm | MEMORY BLOCK | MBm |

: m=2k

ACHIEVED BY READ MODIFY WRITE

:LOAD
:STORE

:READ MODIFY WRITE

PARALLEL OPERATIONAL PROCESSING DEVICE

CROSS REFERENCES

Co-pending, commonly assigned Japanese Patent Application No. 2004-171658 and Japanese Patent Application No. 2005-143109 (U.S. Ser. No. 11/148,369) relate to the present application, contents of which are incorporated herein by reference.

BACKGROUND OF THE INVENTION

1. Field of the Invention

The present invention relates to a parallel operational processing device, and particularly to a construction of a parallel operational processing device having a semiconductor memory and an ALU (arithmetic and logic unit) integrated together.

2. Description of the Background Art

In a field of portable equipments and in application of image processing, it has been recently demanded, due to improved performances, to process a large amount of audio or video data at a higher speed. For processing a large amount of data, a dedicated DSP (Digital Signal Processor) is generally used in many cases. When the dedicated DSP is used, hardware thereof is fixedly set, and a data bit width and processing contents are restricted. For flexibly accommodating for various applications, it is now required to execute such processing with a programmable processor that can change its functions through software. Particularly, in view of reduction in size, it is important in such a data processing system to achieve fast processing with a small area and low power dissipation.

In the processing of audio and image data, a plurality of sets of data are frequently subject to the same arithmetic or logic operation. For such a processing application, therefore, SIMD (Single Instruction Stream Multiple Data Stream) processor is often used. In such SIMD processor, processor elements each constructed by a register file and an ALU are arranged in parallel, and are operated in parallel by the same instruction. These processor elements in parallel are 256 in number, enabling parallel operational processing on 256 sets of data, as disclosed in Reference 1 (Japanese Patent Laying-Open No. 2003-186854).

In the SIMD processor, each processor element stores multi-bit data in a register file. The ALU receives corresponding multi-bit data from a register in the file, and executes operational processing. The result of the operational processing is stored back into a register of the corresponding register file. Therefore, the bit width of the operation data to be processed depends on a bit width of the ALU or register. As disclosed in Reference 1, the change in bit width of the operation data can be handled by changing the number of the registers used in the operation in the register file. However, when 16-bit operation data is to be stored using, e.g., an 8-bit register, it is necessary to set an upper-bit register and a low-bit register, which in turn are successively switched for performing an operational processing. Therefore, when multiplication processing is performed according to a Booth's algorithm by obtaining a partial product and then adding the partial products to obtain a final product, such a problem arises that switching between the registers is extremely complicated for aligning digit positions of the operation data.

Also, the processing procedure must be changed depending on switching and non-switching of the registers. Accordingly, the processing procedure must be changed according to the bit width of the operation data, and it is impossible to deal with the change in bit width with flexibility.

The SIMD processor performs the parallel arithmetic or logic operation on multi-bit data, and the ALU is a multi-bit ALU and therefore requires a large layout area, which impedes reduction in size.

For overcoming such problem of the SIMD processor as described above, the group of the inventors has already proposed a parallel operational processing device achieving a fast arithmetic/logic operation (e.g., by Japanese Patent Application No. 2004-171658 and Japanese Patent Application No. 2005-143109 (U.S. Ser. No. 11/148,369)), the contents of which are incorporated herein by reference. The parallel operational processing device has a basic construction in which a memory cell array is divided into a plurality of entries, and one-bit ALU is arranged corresponding to each entry. Each entry stores operation data. Each ALU performs arithmetic or logic operation in bit serial manner. For example, data bits are read from corresponding entries in memory cell arrays that are placed on the opposite sides of the ALUs, and are transferred to the corresponding ALU, which in turn execute the operation on the received data bits and stores the result of operation in a predetermined entry.

The arithmetic/logic operation is performed on multiple words in bit serial manner (word parallel and bit serial manner). Therefore, an operation on each data item requires much time, but fast processing can be achieved by increasing the number of entries and increasing the degree of parallelism. For example, in an operation environment requiring one machine cycle for each of read, write and operational processings, one-bit arithmetic/logic operation requires three machine cycles. Therefore, the processing of 8-bit data requires twenty-four (=3·8) machine cycles. However, when the entries are provided, e.g., 1024 in number, operation on 1024 sets of data can be completed in twenty-four machine cycles. The operation data is generally 32 or 64 bits in bit width. Therefore, fast operations can be achieved by increasing the number of entries.

Since the arithmetic/logic operation is performed in a bit serial manner, the change in bit width of the operation data can be accommodated for by changing an accessing address range of the entry. The change in processing procedure such as register switching is not required, and the change in bit width of the operation data can be easily made.

The ALU is a one-bit ALU, and can have a small layout area. When bit lines of a memory cell array are used as entries, the ALUs can be arranged corresponding to the entries, respectively, and it is possible to achieve the parallel operational processing device having a small layout area and an extremely high operation parallelism.

For further increasing the operation parallelism, it is necessary to arrange more efficiently the ALUs and peripheral circuitry of the memory cell array. However, a region where the ALUs and the peripheral circuits are determined depends on a pitch of memory cells. Since a layout rule for the memory cell array and the pitch of memory cells are set in advance, further improvement is required for efficiently arranging the ALUs and the peripheral circuitry with a layout area reduced further.

The memory cell array is formed using, e.g., an SRAM (Static Random Access Memory) not requiring refreshing. Since the arithmetic/logic operation is performed on data in bit serial manner, when read modify operation is executed in which the reading of data and the writing of an operation result are performed in one cycle, in order to speed up the operational processing, the operation frequency of the SRAM that performs reading and writing of data in one machine cycle becomes higher than that of the ALU. Consequently, the operation frequency of the SRAM limits the operation speed of the parallel operational processing device, and therefore the operating manner of the SRAM must be further considered for achieving faster arithmetic/logic operations.

Further, a higher operation frequency increases power consumption. For increasing the operation speed, it is necessary to increase layout area of the elements for increasing a current driving capability, resulting in an increased power consumption. Further, the number of entries must be increased for increasing the parallelism degree of operations. In such case, the circuits operating in parallel increase in number, and the current consumption increases. Therefore, further devising is required also in view of the above for increasing the degree of operation parallelism and the operation speed without increasing the power consumption.

SUMMARY OF THE INVENTION

An object of the invention is to provide a parallel operational processing device that can achieve a fast operation and a super-fast parallel operation with low power consumption.

A parallel operational processing device according to the invention includes a plurality of memory blocks each having a plurality of memory cells arranged in rows and columns, and a plurality of bit lines arranged corresponding to the respective memory cell columns, a plurality of operational processing units arranged between the plurality of memory blocks, and each having a plurality of operation units each executing an operational processing operations on received data, and a plurality of data transfer circuits each including data write/read circuits arranged alternately on the opposite sides of the bit lines in each of the memory blocks, for transferring data with the operation units in adjacent operational processing units.

In each memory block, the data write/read circuits of the data transfer circuit are arranged alternately on the opposite sides of the bit lines in each of the memory blocks. Thereby, pitch conditions of the data transfer circuit and the operation units of the operational processing unit are mitigated, and these circuit components can be efficiently arranged with a margin. The data write/read circuits arranged in each data transfer circuit are reduced in number, and the columns (bit lines) per one bit of input/output data are reduced in number, so that a layout area can be reduced. Also, the circuits to be operated are reduced in number, and the power consumption is reduced.

Since the operational processing unit is arranged between the memory blocks, an isolation region for arranging dummy cells and the like is not required between the memory blocks, and the occupation area of the memory cell arrays can be reduced.

When one word line is selected in a memory block, the data to be transferred to operation units on the opposite sides of the memory block can be selected concurrently. Therefore, when a parallel operation is to be performed using each memory block as a bank, the read/write of the operation data of the two banks can be performed by selecting one word line so that the selected word line can be reduced in number, and accordingly, the power consumption required for the word line selection can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 schematically shows a whole layout of the parallel operational processing device according to a first embodiment of the invention.

DESCRIPTION OF THE PREFERRED EMBODIMENTS

[Starting Construction]

Figure 1:
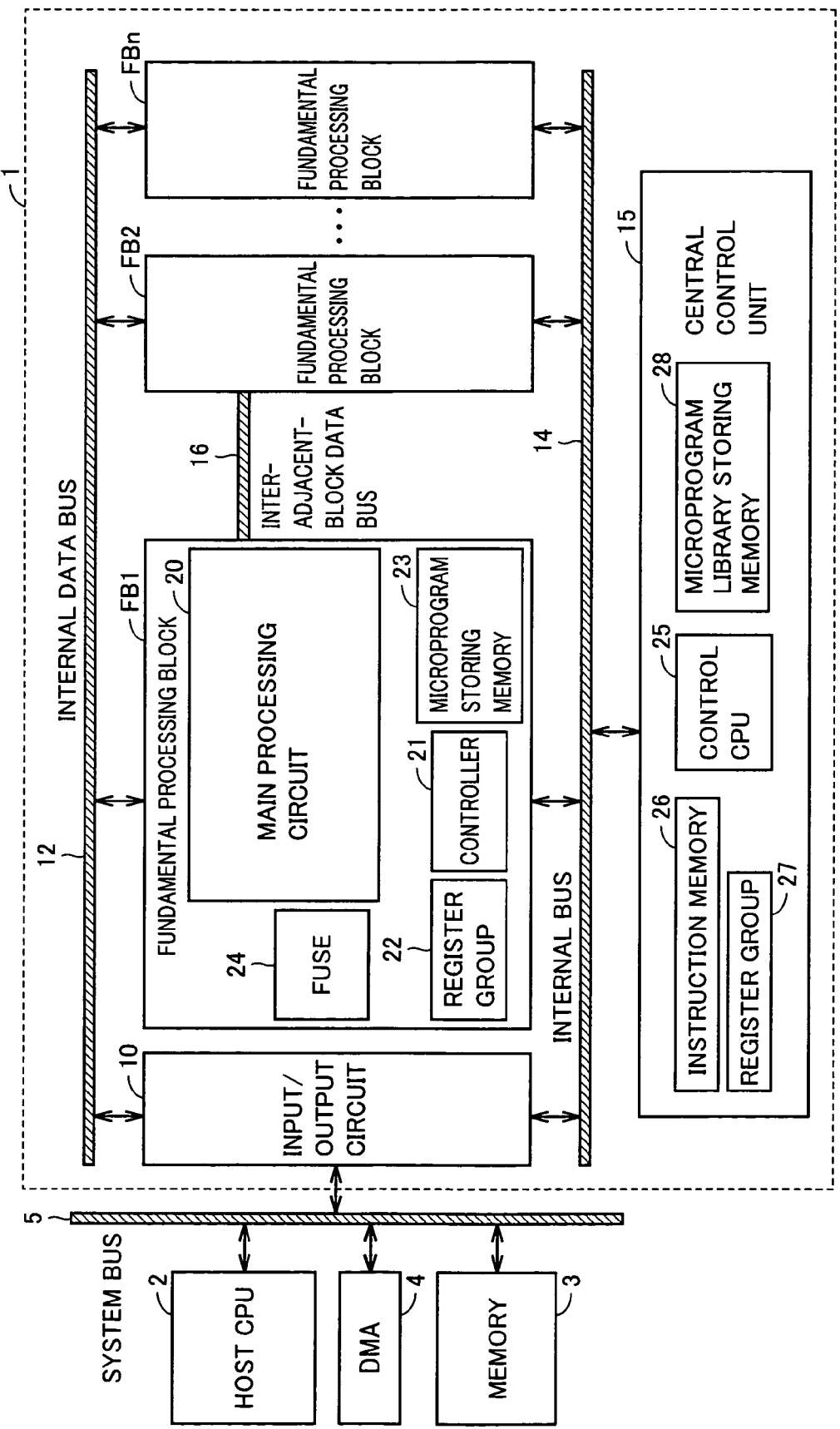
FIG. 1 schematically shows a conceptual construction of a parallel operational processing device according to the invention.

FIG. 1 shows a conceptual construction of a system using a parallel operational processing device according to the invention. The parallel operational processing device according to the invention implements an operational processing device shown in FIG. 1. For better and easy understanding of operations and functions of the parallel operational processing device according to the invention, description is first given on a conceptual construction and processing operations of a processing system using the parallel operational processing device with reference to FIG. 1.

Referring to FIG. 1, an operational processing system includes a semiconductor processing device 1 executing parallel operations; a host CPU 2 performing a control on a process in semiconductor processing device 1, control of the whole system and data processing; a memory 3 used as a main storage of the system and storing various necessary data; and a DMA (Direct Memory Access) circuit 4 for directly accessing the memory 3 without the use of host CPU 2. By the control of DMA circuit 4, data can be transferred between memory 3 and semiconductor processing device 1, and in addition, semiconductor processing device 1 can be accessed directly.

Host CPU 2, memory 3, DMA circuit 4 and semiconductor processing device 1 are connected to each other through a system bus 5. Semiconductor processing device 1 includes a plurality of fundamental processing blocks FB1 to FBn provided in parallel, an input/output circuit 10 for transferring data/instruction with system bus 5 and a central (concentrated) control unit 15 for controlling operations and processes in semiconductor processing device 1.

Fundamental processing blocks FB1 to FBn are coupled to an internal data bus (global data bus) 12, while central control unit 15, input/output circuit 10 and fundamental processing blocks FB1 to FBn are coupled to an internal bus 14. Between fundamental processing blocks FB (generically representing blocks FB1 to FBn), an inter-adjacent-block data bus 16 is provided (in FIG. 1, inter-adjacent-block data bus 16 arranged between fundamental processing blocks FB1 and FB2 is shown as a representative).

By providing fundamental processing blocks FB1 to FBn in parallel, same or different processing operations are executed in parallel within semiconductor processing device 1. These fundamental processing blocks FB1 to FBn are of the same configuration, and therefore, the configuration of fundamental processing block FB1 is shown as a representative in FIG. 1.

Fundamental processing block FB1 includes a main processing circuit 20 including a memory mat having memory cells arranged in rows and columns; a microprogram storing memory 23 for storing an micro-coded execution program; a controller 21 for controlling an internal operation of fundamental processing block FB1; a register group 22 used as an address pointer an others; and a fuse circuit 24 for executing a fuse program for repairing any defect of main processing circuit 20.

Control is passed to controller 21 in accordance with a control instruction supplied via system bus 5 and input/output circuit 10 from host CPU 2, and controller controls operations of corresponding fundamental processing blocks FB1 to FBn. These fundamental processing blocks FB1 to FBn are each provided with microprogram storing memory 23, and controller 21 stores an execution program in memory 23. As such, the contents of processing to be executed in each of fundamental processing blocks FB1 to FBn can be changed, and the contents of processing of arithmetic or logical operations to be executed in each of fundamental processing blocks FB1 to FBn can be changed.

Inter-adjacent-block data buses 16 are provided for data transfer among fundamental processing blocks FB1 to FBn. Inter-adjacent-block data bus 16 allows high speed data transfer between fundamental processing blocks without exclusively using internal data bus 12 (global data bus). By way of example, while a data is being transferred to a certain fundamental processing block through internal data bus 12, data can be transferred between different fundamental processing blocks.

Central control unit 15 includes a controlling CPU 25; an instruction memory 26 storing an instruction to be executed by the controlling CPU; a register group 27 including a working register for controlling CPU 25 or a register for storing a pointer; and a microprogram library storing memory 28 storing a library of microprograms. Central control unit 15 has control right passed to from host CPU 2 through internal bus 14, and controls processing and operations of fundamental processing blocks FB1 to FBn through internal bus 14.

Microprograms describing various sequential processes in a code form are stored as a library in microprogram library storing memory 28, and therefore, it becomes possible to select a necessary microprogram from central control unit 15 for changing the microprogram stored in microprogram storing memory 23 of fundamental processing blocks FB1 to FBn. Thus, it becomes possible to handle a change in the content of processing in a flexible manner.

Further, through the use of fuse circuit 24, a defect in fundamental processing blocks FB1 to FBn can be repaired through spare (redundancy) replacement, so that production yield can be improved.

Figure 2:
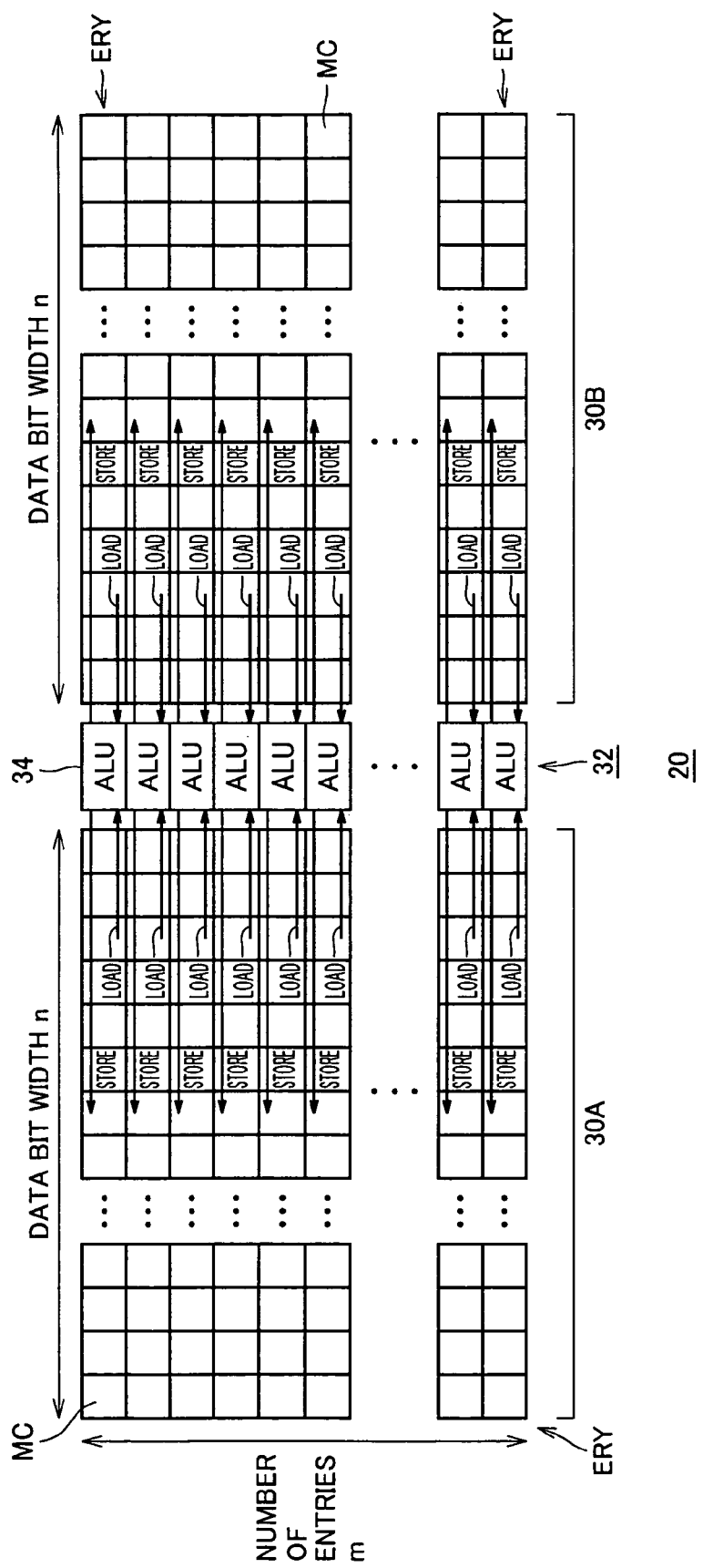
FIG. 2 schematically shows an internal construction of a main processing circuit shown in FIG. 1.

FIG. 2 schematically shows a basic construction of main processing circuit 20 shown in FIG. 1. Referring to FIG. 2, main processing circuit 20 includes memory cell mats 30A and 30B as well as an operational processing unit 32 arranged between memory cell mats 30A and 30B.

Each of memory cell mats 30A and 30B is divided into m entries ERY. Entry ERY has a bit width of n bits. A specific construction of this memory cell mat will be described later. In memory cell mats 30A and 30B, memory cells MC building up each entry ERY are static random access memory cells.

Operational processing unit 32 includes operational units (ALUs; Arithmetic and Logical Units) 34 arranged corresponding to entries ERY of memory cell mats 30A and 30B. In FIG. 2, operational units (ALUs; merely referred to as ALUs hereinbelow) 34 are each shown executing 1-bit operation. However, ALU may execute 2-bit operation. In operational processing unit 32, ALU 34 performs a designated arithmetic or logic operation on the data in a corresponding entry. ALU 34 can execute arithmetic and logic operations such as addition, subtraction, logical product, exclusive logical sum OR and others.

When ALU 34 performs a binary operation, memory cell mats 30A and 30B store respective terms of operation target data, and one of memory cell mats 30A and 30B stores a result of the operation. Bits of the operation target data in entry ERY are sequentially read into ALU 34, and an arithmetic or logic operation is executed in bit serial manner. In operations illustrated in FIG. 2, data of memory cells MC are read from memory cell mats 30A and 30B, and are transferred (loaded) to ALUs 34, and the results of the operation are stored in the memory cells.

Both memory cell mats 30A and 30B are not required to store a set of data of operation targets, and the amount of data to be stored in one memory cell mat can be reduced. Thereby, the length of the bit line (entry ERY is formed in the extending direction of the bit line) can be reduced, and the fast data transfer can be achieved.

Figure 3:
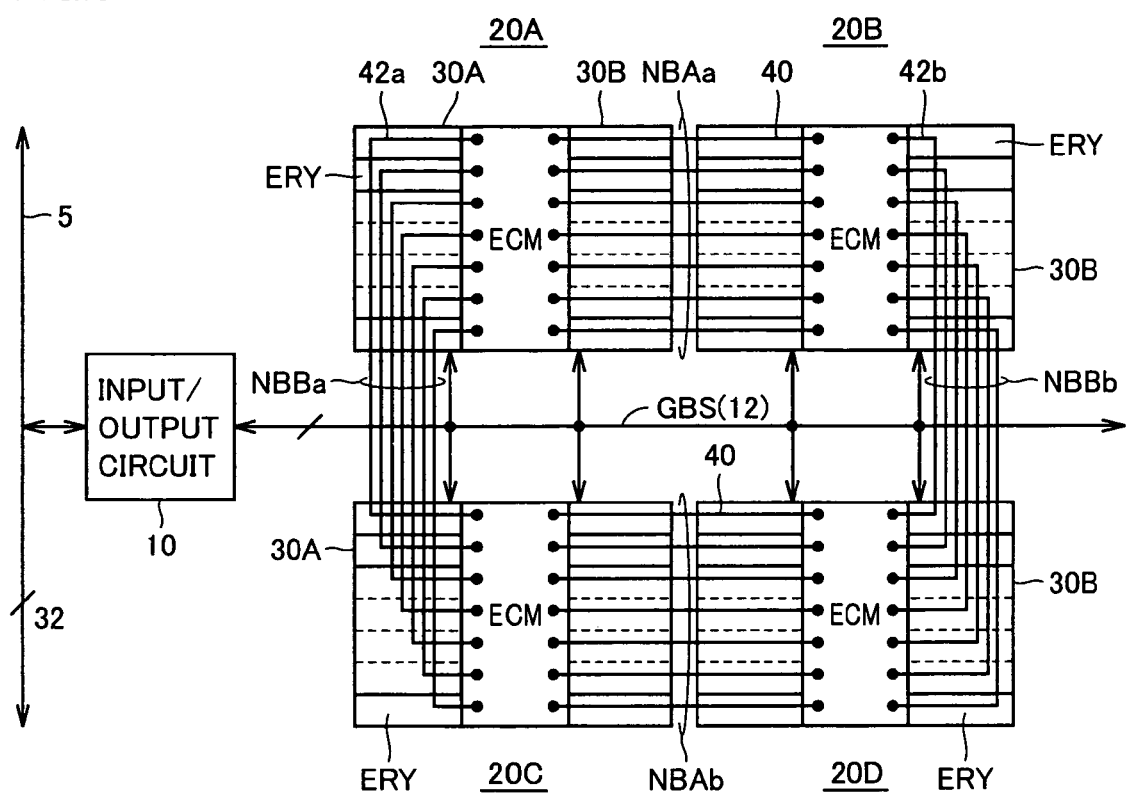
FIG. 3 schematically shows a conceptual construction of an internal arrangement of a fundamental processing block of the parallel operational processing device shown in FIG. 1.

FIG. 3 shows a specific connection form of inter-adjacent-block data bus 16 shown in FIG. 1 together with a specific arrangement of the main processing circuits. Referring to FIG. 3, main processing circuits 20A to 20D are coupled in parallel to a global data bus GBS corresponding to internal data bus 12 shown in FIG. 1. Each of main processing circuits 20A to 20D includes memory cell mats 30A and 30B as well as an ALU group (operational processing unit) arranged between memory cell mats 30A and 30B. FIG. 3 does not show the ALU group. An inter-ALU interconnecting switch circuit ECM is arranged for interconnecting the ALUs (34) of the ALU group in each main processing circuit. Owing to inter-ALU interconnecting switch circuit ECM, a processing such as an arithmetic or logic operation can be executed on data of the entries physically spaced away from each other.

Each of memory cell mats 30A and 30B is divided into a plurality of entries ERY, and inter-ALU interconnecting switch circuit ECM internally includes ALU interconnecting circuits for respective entries ERY.

Inter-adjacent-block data bus 16 shown in FIG. 1 includes adjacent block entry interconnecting lines 40 for interconnecting the ALU interconnecting circuits in adjacent main processing circuits (in inter-ALU interconnecting switch circuits ECM). Adjacent block entry interconnecting lines 40 interconnect the entries at the same positions in main processing circuits 20 (20A to 20D) of the adjacent fundamental processing blocks.

Global data bus GBS is coupled to external system bus 5 via input/output circuit 10. FIG. 3 shows, by way of example, external system bus 5 of a 32-bit width. In adjacent main processing circuits 20A and 20B arranged on the same side with respect to global data bus GBS, the ALUs of the entries in the same positions are interconnected through an adjacent block entry interconnecting bus NBAa. Adjacent block entry interconnecting bus NBAa includes adjacent block entry interconnecting lines 40 interconnecting the ALUs and the ALU interconnecting circuits that are arranged for entries ERY at the same positions in adjacent main processing circuits 20A and 20B.

Adjacent main processing circuits 20C and 20D arranged on the other side with respect to global data bus GBS likewise include adjacent block entry interconnecting bus NBAb. Adjacent block entry interconnecting bus NBAb includes adjacent block entry interconnecting lines 40 interconnecting the ALUs and the ALU interconnecting circuits that are arranged for entries ERY at the same positions in adjacent main processing circuits 20C and 20D.

The adjacent block interconnecting bus (inter-adjacent-block data bus 16) further includes a adjacent block entry interconnecting bus NBBa for interconnecting the ALUs and the ALU interconnecting circuits arranged for the corresponding entries in main processing circuits 20A and 20C opposed to each other with global data bus GBS in between. Adjacent block entry interconnecting bus NBBa includes lines 42a for interconnecting the ALUs and the ALU interconnecting circuits arranged for the entries at the corresponding positions in main processing circuits 20A and 20C.

Likewise, a adjacent block entry interconnecting bus NBBb interconnects the ALUs and the ALU interconnecting circuits arranged for the entries at the corresponding positions in main processing circuits 20B and 20D. Adjacent block entry interconnecting bus NBBb includes lines 42b arranged for the ALUs and the ALU interconnecting circuits.

As shown in FIG. 3, fundamental processing blocks FBi (main processing circuits 20A to 20D) are arranged, and the ALUs and the ALU interconnecting circuits included in the main processing circuit at the opposite end sides on one side with respect to global data bus GBS are connected to the ALUs and the ALU interconnecting circuits included in the main processing circuit at the opposite end sides on the other side with respective to the global data bus. Accordingly, these main processing circuits 20A to 20D are interconnected in a ring form, and the data transfer can be performed between any main processing circuits. Further, the memory cell mats can be efficiently arranged when the memory cell mats of the main processing circuit are arranged in an array form.

As shown in FIG. 3, lines 42a and 42b in adjacent block interconnecting buses NBBa and NBBb interconnect the ALUs and the ALU interconnecting circuits arranged for the entries at the same positions of the main processing circuits opposing to each other. Therefore, mutually connecting lines 42a and 42b in buses NBBa and NBBb have the same length, and can equalize the signal propagation delays. Thus, signal skew can be reduced, and fast data transfer can be achieved.

Adjacent block entry interconnecting buses NBBa and NBBb are comprised of first interconnecting portions extending over memory cell mats 30A and 30B and second interconnecting portions that extend in a direction orthogonal to the first interconnecting portions over the memory cell mats of the main processing circuits opposing to each other with respect to global data bus GBS. By interconnecting the first and second interconnecting portions above the memory cell mats, the interconnecting lines of memory mats opposing to each other with respect to the global data bus can be arranged in a compact manner, and increase in memory array area resulting from increased interconnection area can be suppressed.

FIG. 3 does not show the internal constructions of inter-ALU interconnecting switch circuit ECM. In inter-ALU interconnecting switch circuit ECM, the ALUs and ALU interconnecting circuits are arranged corresponding to the entries, and each ALU is connected to the ALU interconnecting circuit by corresponding line 40, 42a or 42b.

The invention utilizes the construction shown in FIGS. 1 to 3 as a basic construction, and achieves the construction with which the main processing circuits (fundamental processing blocks) are efficiently integrated on a semiconductor chip and implements the parallel operational processing device operating at a high speed with low power consumption.

First Embodiment

FIG. 4 schematically shows a whole construction of a parallel operational processing device according to a first embodiment of the invention. In FIG. 4, a parallel operational processing device 50 is integrated on a semiconductor chip, and includes two memory mats 55A and 55B. Parallel operational processing device 50 shown in FIG. 4 may construct one fundamental processing block, or may include a plurality of main processing circuits as shown in FIG. 3.

Parallel operational processing device 50 may be formed on a semiconductor chip single (in this case, region 50 corresponds to the chip), or may be integrated with other device(s) on the same chip to form a system LSI (in this case, region 50 corresponds to a so-called macro).

Memory mat 55A includes memory blocks MA0 to MAm, and memory mat 55B includes memory blocks MB0 to MBm. In memory mat 55A, operational processing units PA0 to PAm−1 are arranged between the memory blocks. Each of operational processing units PA0 to PAm−1 are each coupled to the adjacent memory blocks through sense amplifier/write driver bands TXA0 to TXAk−1 each of which forms data transfer circuits arranged on the opposite sides of the corresponding operational processing unit. In memory mat 55B, operational processing units PB0 to PBm−1 are likewise arranged between memory blocks MB0 to MBm. Sense amplifier/write driver bands TXB0 to TXBk−1 are arranged between operational processing units PB0 to PBm−1 and the respective memory blocks. Each of sense amplifier/write driver bands TXA0-TXAk−1 and TXB0-TXBk−1 includes a sense amplifier and a write driver.

SRAM peripheral circuits SH0 to SHm corresponding to memory blocks MA0-MAm and MB0-MBm are arranged between memory mats 55A and 55B. Local control circuits LK0 to LKm−1 are arranged in a region between operational processing units PA0-PAm−1 and PB0-PBm−1 of memory mats 55A and 55B.

Each of memory blocks MA0-MA1 and MB0-MBm is constructed by SRAM cells. Peripheral circuits, such as row decoders and word line drive circuits and control circuits controlling the word line selection timing, for writing and reading data of the memory cells in the memory blocks are provided in SRAM peripheral circuits SH0 to SHm.

Local peripheral circuits LK0 to LKm−1 control the processing operations such as the arithmetic or logic operations performed in the corresponding operational processing units, and also control the operations of the sense amplifiers and write drivers in the corresponding sense amplifier/write driver bands.

Since SRAM peripheral circuits SH0 to SHm and local control circuits LK0 to LKm−1 are arranged between memory mats 55A and 55B, memory mats 55A and 55B can share the peripheral circuits such as address pointers producing row addresses and row address decode circuits. Thereby, the layout area of the SRAM peripheral circuits can be reduced.

Further, the memory mats can share the circuit portions in local control circuits LK0 to LKm−1 producing internal control signals except for mat specifying signals. When these operational processing units execute the same operations in parallel, memory mats 55A and 55B can share the circuit portions performing the operation control in the local control circuits, and thus the layout area can be reduced.

Although the internal construction of the memory block will be described later in detail, each of memory blocks MAi and MBi (i=0−m) is used by the operational processing units on their both sides. Specifically, in contrast to the construction in which the operational processing circuit (the circuit portion represented as circuit ECM) is shared by the memory cell mats on both sides thereof as shown in FIG. 3, in the construction shown in FIG. 4, any adjacent operational processing units are arranged to share a memory block in each memory mat. Therefore, as shown in FIG. 3, the operational processing unit is arranged in the region between the memory cell mats and between the main processing circuits, and a region, such as a circuit region for dummy cells, for isolating the SRAM blocks is not required, so that the layout area can be reduced.

In each of memory mats 55A and 55B, the global data bus is arranged to be shared with the memory blocks, and global bus interfaces 60a and 60b are arranged at the respective one-ends of memory mats 55A and 55B for providing external interfaces to the global data bus. Global bus interfaces 60a and 60b may be input/output circuits shown in FIG. 1, or may be circuits providing interface to the bus between the input/output circuits and the parallel operational processing device.

Figure 5:
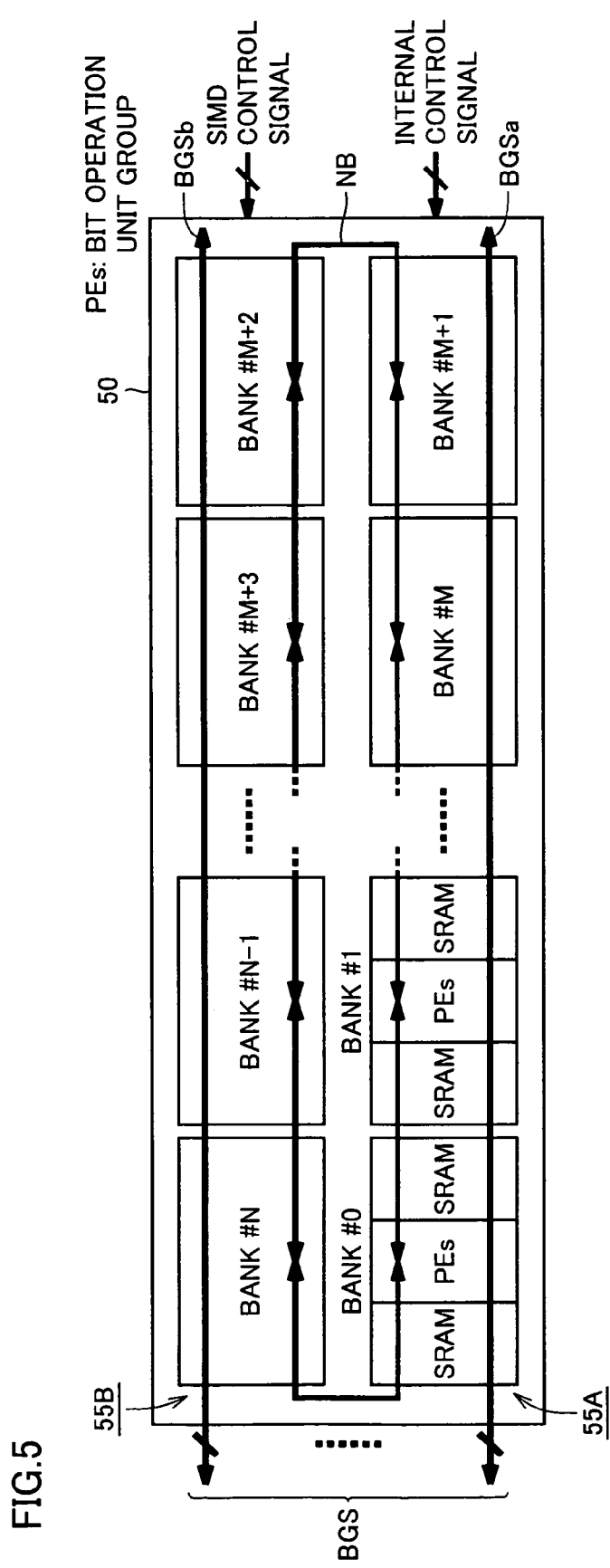
FIG. 5 shows a functional construction of the parallel operational processing device shown in FIG. 4.

FIG. 5 shows an equivalent construction and an internal bus arrangement of parallel operational processing device 50 shown in FIG. 4. In FIG. 5, banks #0 to #M+1 are arranged in memory mat 55A, and banks #M+2 to #N are arranged in memory mat 55B.

Each of these banks 0 to #M+1, #M+2 to #N is constructed by the operational processing units (a bit-operation unit group PEs) and the memory blocks (SRAMs) on the opposite sides thereof. Therefore, each of banks #0 to #N individually executes the processing (arithmetic/logic) operation.

A global data bus BGSa is arranged for banks #0 to #M+1, and global data bus BGSb is arranged for banks #M+2 to #N. These global data buses BGSa and BGSb correspond to global data bus BGS already described with reference to FIG. 1. As described above, global data bus BGS may be coupled to the input/output circuits shown in FIG. 1 through global bus interfaces 60a and 60b shown in FIG. 4, and may be coupled to the system bus through global bus interfaces 60a and 60b. Global data bus BGS may be subjected to a bit width adjustment by and in global bus interfaces 60a and 60b shown in FIG. 4, and then it may be coupled to the internal bus shown in FIG. 1, and then to the input/output circuit shown in FIG. 1.

In parallel operational processing device 50 shown in FIG. 5, each of banks #0 to #N individually executes an arithmetic or logic operation. An inter-ALU connecting line (bus) NB couples banks #0 to #N to the bit operation unit group corresponding to the ALUs in a ring form. The term "bit operation unit" is used for the following reason. As will be described later, a two-bit parallel processing or arithmetic/logic operation is executed in this embodiment. Therefore, instead of the operational unit (ALU) executing a one-bit operational processing, the reference characters of bit operation unit PE is used for clarifying the difference in construction. The construction of bit operation unit will be described later.

In each of banks #0-#N, as shown in FIG. 5, operational processing units (PEs) each execute an arithmetic or logic operations using the storage data of the memory blocks (SRAMs) on its opposite sides. When the memory blocks are individually arranged in the banks, an SRAM boundary region for arranging the dummy circuit must be employed for isolating the memory blocks (SRAMs) in the adjacent banks as shown conceptually in FIG. 5. The adjacent memory blocks (SRAM) are shared by the operational processing units on the opposite sides of the respective memory blocks, so that the empty region as described above can be eliminated.

In parallel operational processing device 50, an operation instruction is supplied commonly to banks #0 to #N by an SIMD control signal. According to the internal control signals, transfer of the data of memory cells, updating of addresses and others are performed, and accordingly, banks #0 to #N perform in parallel an arithmetic or logic operation as instructed. Each of banks #0 to #N corresponds to the fundamental processing block shown in FIG. 1, and the operational processing unit and the memory blocks on the opposite sides thereof correspond to the main processing circuit shown in FIG. 1.

The SIMD control signal and the internal control signal are applied from central control unit 15 shown in FIG. 1 to the fundamental processing blocks forming the respective banks. According to the SIMD control signal, banks #0 to #N execute, in parallel, the same processing (arithmetic/logic) operation according to the same instruction (the banks executing the processing (arithmetic/logic) operation may be designated according to a bank address). In this case, therefore, controller 21 in each fundamental processing block functions as a local control circuit, and controls the internal operations of the corresponding banks (fundamental processing blocks). Since contents of the processing (arithmetic/logic) operation in the ALU (bit-operation unit) in the operational processing unit are set according to the SIMD control signal, it is not particularly required to employ microprogramming storing memory 23. The register group may be arranged in each bank for producing an address pointer.

Local control circuit may individually and independently perform the setting of the operation contents and the production of the internal control signals. In this case, different banks can execute different arithmetic/logic operations.

Figure 6:
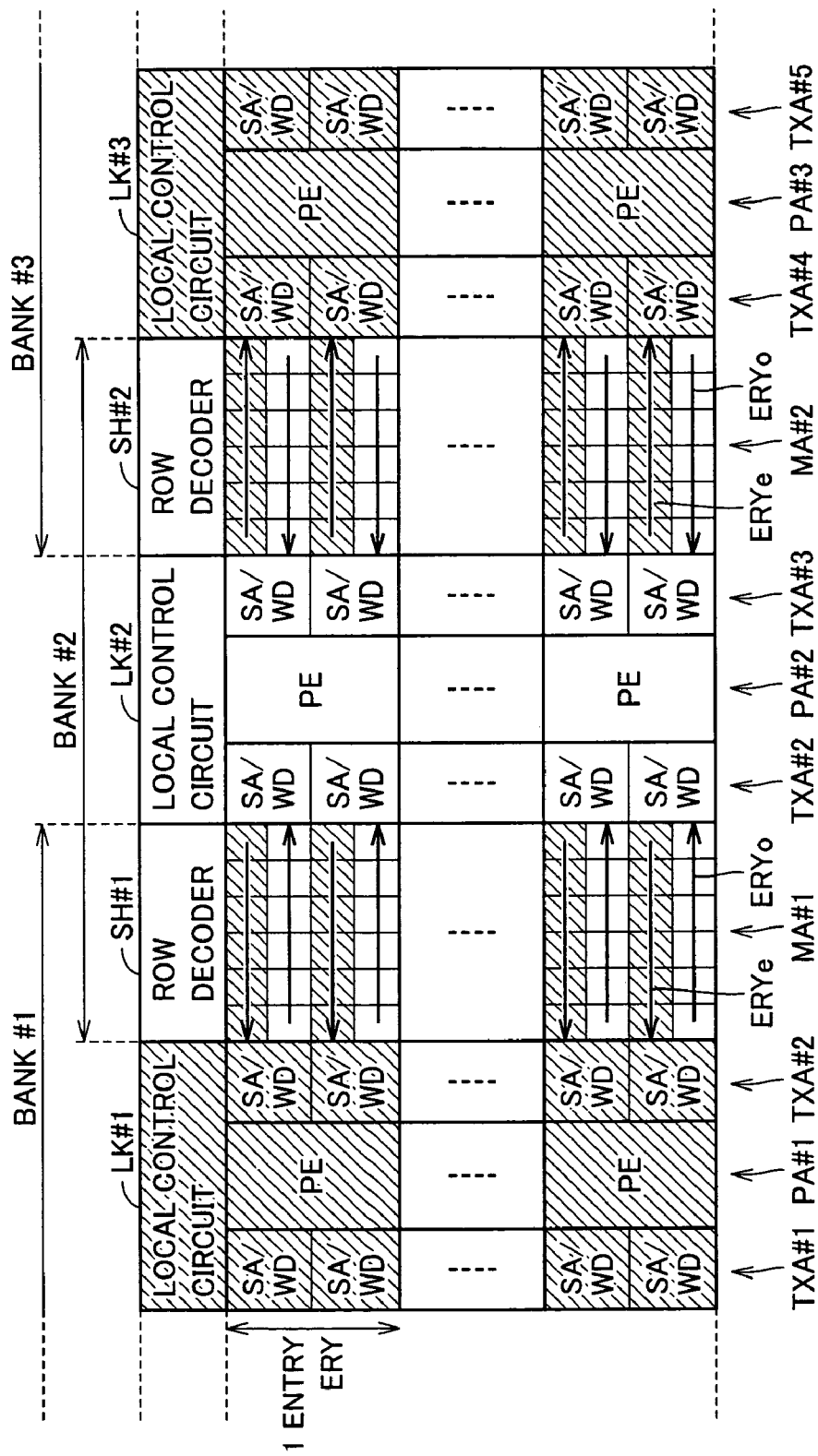
FIG. 6 specifically shows constructions of memory blocks and operational processing units in the layout shown in FIG. 4.

FIG. 6 shows more specifically the construction of the memory mats of the parallel operational processing device shown in FIG. 4. FIG. 6 shows, as a representative, constructions for banks #1, #2 and #3.

In FIG. 6, an even-numbered sub-entry ERYe in memory block MA#1 is used as an operation data storage region of bank #1, and odd-numbered sub-entries ERYo of memory blocks MA#1 and MA#2 are used as an operation data storage region of bank #2. Even-numbered sub-entry ERYe of memory block MA#2 is used as the operation data storage region of bank #3. Each of sub-entries ERYe and ERYo is constructed by one column of the memory cells in the corresponding memory block, and is configured to transfer the internal data through an associated bit line pair.

Two sub-entries form one entry, which stores the operation data. The two sub-entries store bits at even- and odd-numbered addresses of the operation data, respectively. By selecting one word line, the odd- and even-numbered address bits of the operation data are read out in parallel for executing the 2-bit parallel operation by bit operation unit PE.

Bank #1 includes a sense amplifier/write driver band TXA#1 forming a data transfer circuit that is provided for a memory block (not shown); a sense amplifier/write driver band TXA#2 including sense amplifiers/write drivers that are provided for even-numbered sub-entries ERYe in memory block MA#1; and an operational processing unit PA#1 arranged between sense amplifier/write driver bands TXA#1 and TXA#2. In operational processing unit PA#1, one bit operation unit PE is arranged for two entries. Therefore, one one-bit operation unit PE is arranged for each four sub-entries (bit line pairs).

Likewise, bank #2 includes sense amplifier/write driver bands TXA#2 and TXA#3 transferring the data between odd-numbered sub-entries ERYo of memory blocks MA#1 and MA#2, and operational processing unit PA#2 arranged between these sense amplifier/write driver bands TXA#2 and TXA#3.

Bank #3 includes sense amplifier/write driver bands TXA#4 and TXA#5 that transfer data of even-numbered sub-entries ERYe of memory block MA#2 and a memory block (not shown), and operational processing unit PA#3 arranged between sense amplifier/write driver bands TXA#4 and TXA#5. In operational processing units PA#2 and PA#3 for banks #2 and #3, one bit operation unit PE is arranged for each two entries (four sub-entries).

In banks #1, #2 and #3, local control circuits LK#1, LK#2 and LK#3 that control the write/read of data and the arithmetic/logic operation, are provided corresponding to the operational processing units and the sense amplifier/write driver bands. These local control circuits LK#1, LK#2 and LK#3 are made active when corresponding banks #1 to #3 are selected, respectively. When activated, local control circuits LK#1, LK#2 and LK#3 each set the internal timing for data writing/reading and arithmetic/logic operation, and in addition the operation contents of bit operation unit PE according to the SIMD control signal.

Each of the row decoders included in SRAM peripheral circuits SH#1 and SH#is shared by the banks sharing the memory block, and is activated to drive an addressed word line to the selected state according to an applied word line address. Since adjacent banks share the row decoder, each bank executes an arithmetic/logic operation on the data bits at the same (row) address.

As shown in FIG. 6, a set of a sense amplifier SA and a write driver WD is arranged corresponding to two sub-entries (two bit line pairs). Therefore, the pitch conditions for sense amplifiers SA and write drivers WD can be mitigated as compared with the construction in which the sense amplifier and the write driver are arranged for each of four columns of memory cells.

Figure 7:
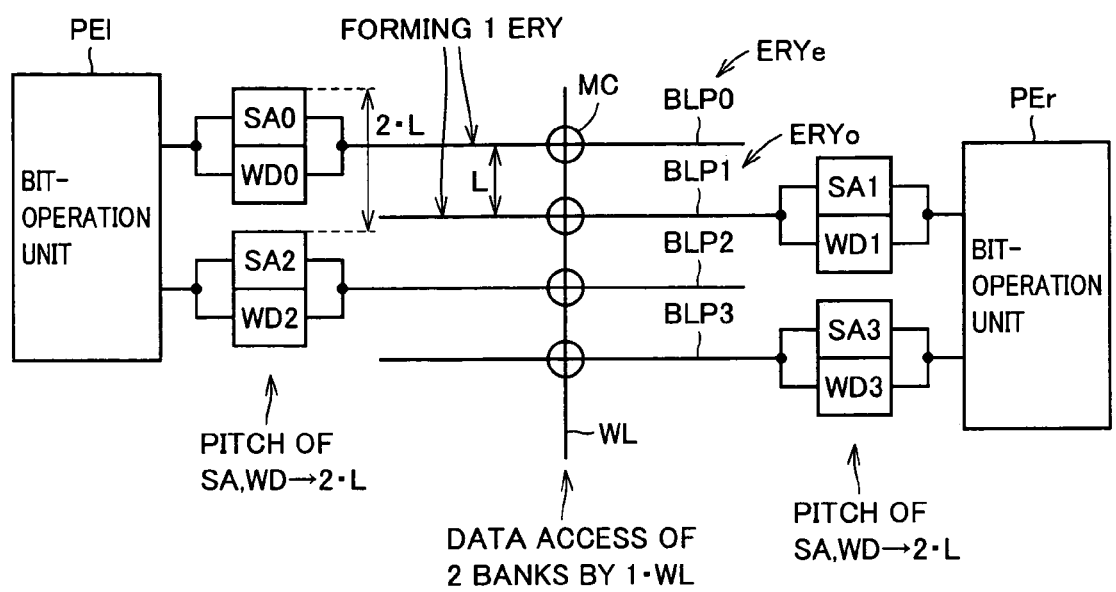
FIG. 7 schematically shows internal constructions of the memory block and the operational processing units shown in FIG. 6.

FIG. 7 shows more specifically the arrangement of sense amplifiers SA and write drivers WD. FIG. 7 shows four bit line pairs BLP0 to BLP3. Memory cells (SRAM cells) MC are arranged corresponding to crossings of bit line pairs BLP0 to BLP3 and word line WL. A left end of bit line pair BLP0 is coupled to sense amplifier SA0 and write driver WD0. A left end of bit line pair BLP2 is coupled to sense amplifier SA2 and write driver WD2. A right end of bit line pair BLP1 is coupled to sense amplifier SA1 and write driver WD1, and a right end of bit line pair BLP3 is coupled to sense amplifier SA3 and write driver WD3.

Sense amplifiers SA0 and SA2 as well as write drivers WD0 and WD2 are coupled to bit operation unit PE1 arranged on the left side in the figure, and sense amplifiers SA1 and SA3 as well as write drivers WD1 and WD3 are coupled to bit operation unit PEr arranged on the right side in the figure.

Each of bit line pairs BLP0 and BLP2 constitutes a data transfer line for even-numbered sub-entry ERYe, and each of bit line pairs BLP1 and BLP3 constitutes a data transfer line for odd-numbered sub-entry ERYo. Bit operation unit PE1 on the left side performs the arithmetic/logic operation on the data of the memory cells connected to bit line pairs BLP0 and BLP2 of even-numbered sub-entries ERYe, and bit operation unit PEr executes the arithmetic/logic operation on the data of the memory cells on bit line pairs BLP1 and BLP3 forming odd-numbered sub-entries ERYo.

One entry is comprised of two bit line pairs BLP. Since each of bit operation units PE1 and PEr is arranged corresponding to four bit line pairs BLP0 to BLP3, bit operation units PE1 can be arranged with a sufficient margin. A set of sense amplifier SA (SA0 to SA3) and write driver WA (WD0 to WD3) is arranged alternately on the ends of these bit line pairs BLP0 to BLP3. Therefore, when the pitch of bit line pairs is L (i.e., bit line pitch is L/2), the pitch of sense amplifiers SA and write drivers WD can take a large value of 2·L. Further, the sense amplifiers and write drivers arranged in one sense amplifier/write driver band are reduced in number, so that the layout area of the peripheral circuits such as the sense amplifiers/write drivers can be reduced.

Data of the memory cells of two banks can be accessed by selecting one word line WL. Accordingly, the selected word lines can be reduced in number as compared with the construction as conceptually shown in FIG. 5. Specifically, in the construction of two memory blocks being provided in each bank, the word lines that are twice as many as the banks must be selected for data accessing. However, in the construction shown in FIGS. 6 and 7, when data access is made, data can be written or read in each bank only by selecting the word lines greater in number by one than the banks. Thus, the power consumption in word line selecting operation can be reduced.

Figure 8:
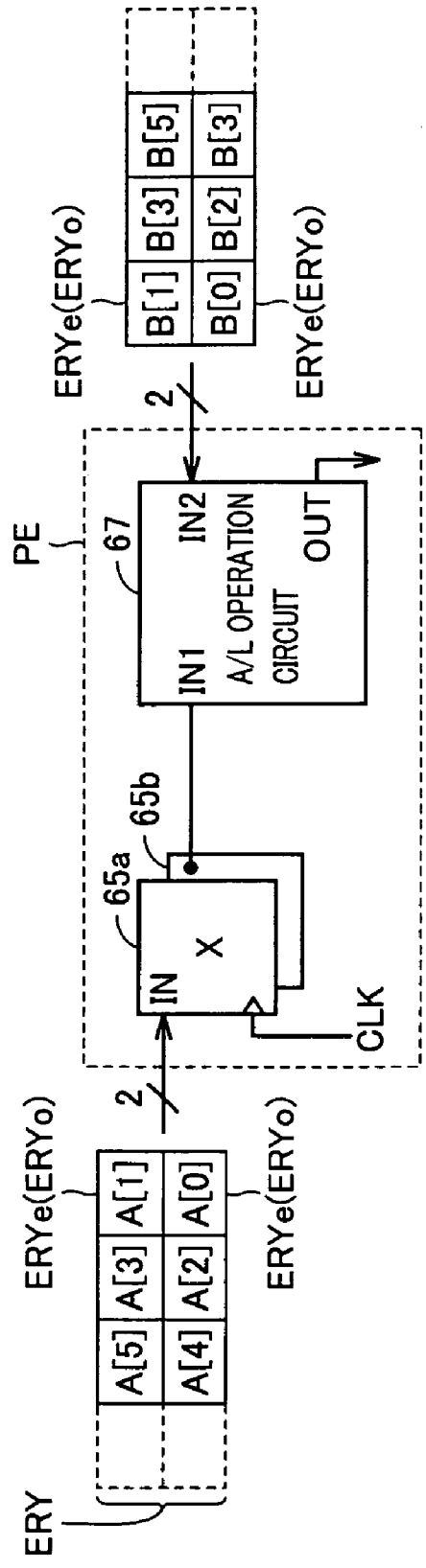
FIG. 8 schematically shows an internal construction of a bit operation unit shown in FIG. 6.

FIG. 8 shows an example of the construction of bit operation unit PE shown in FIG. 6. In FIG. 8, bit operation unit PE includes two registers (X-registers: higher- and lower-bit registers XH and XL) 65a and 65b arranged in parallel, and an arithmetic/logic operation circuit 67 that has an input IN1 receiving two-bit data from registers 65a and 65b as well as an input IN2 receiving two-bit data read from another memory block, and performs an arithmetic or logic operation on the received data. Output OUT of arithmetic/logic operation circuit 67 is transferred to one of the corresponding memory blocks through an internal data transfer path (not shown) in the bit operation unit.

In this construction, two-bit data, e.g., A[0] and A[1] are read from two sub-entries ERYe and ERYo in one memory block, and are stored in registers 65a and 65b. Concurrently, two-bit data B[0] and B[1] are read from the other memory block, and are applied to input IN2 of arithmetic/logic operation circuit 67. Then, arithmetic or logic operation is performed on the two-bit data stored in registers 65a and 65b as well as the two-bit data applied to input IN2 of arithmetic/logic operation circuit 67. For example, in the addition operation, the addition is sequentially performed on the data bits starting at the lower bit side, and the result of addition is written (stored) into one of the memory blocks.

By executing the two-bit operational (arithmetic or logic) processing, two-bit multiplication processing can be executed fast according to a secondary Booth's algorithm, as can be seen in a parallel operational processing device proposed by the group of the inventors (refer to Japanese Patent Laying-Open No. 2005-143109: U.S. Ser. No. 11/148,369).

By switching the connection path for inputs of X-registers 65a and 65b, the one-bit processing (arithmetic or logic) operation can be performed. In such case, the connection path of input IN2 in arithmetic/logic operation circuit 67 is switched so as to perform the one-bit operational processing. Also, the path for output OUT is internally switched to supply a result of an operational processing on one-bit data.

In this two-bit processing operation, the two-bit data can be sequentially read by switching the pointer of a word line address. The data bits at the even- and odd-numbered addresses are stored at the same word line address in a common memory block. For the two-bit parallel operational processing, therefore, two sub-entries constitutes one entry ERY.

When sequential or serial operational processing is to be performed bit by bit on the data of one entry register, the connection between one of X-registers 65a and 65b and the sense amplifier/write driver of the memory block is sequentially switched (or the connection between the outputs of X-registers 66a and 66b and input IN1 of the arithmetic/logic operation circuit is sequentially switched).

Figure 9:
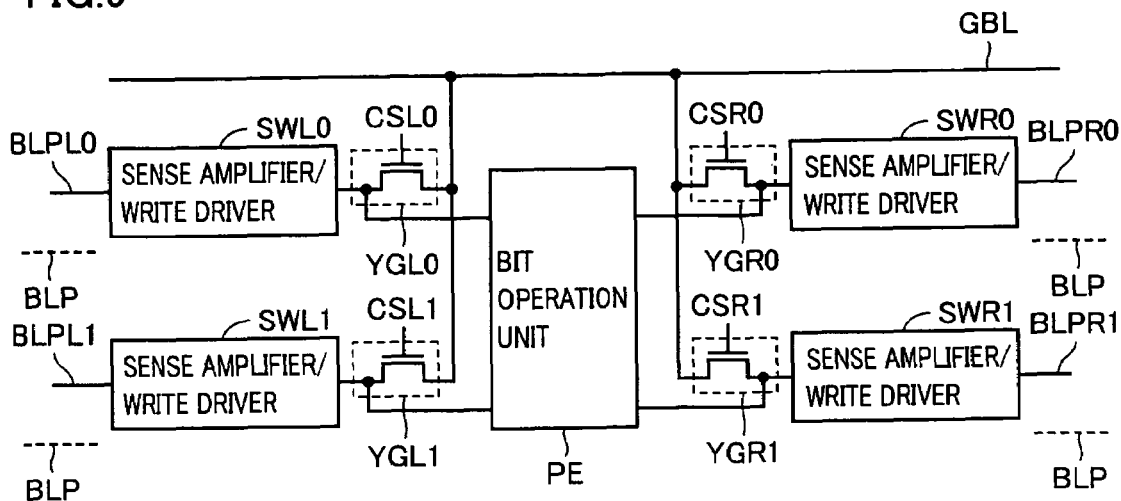
FIG. 9 shows an example of a configuration of connection between sense amplifiers/write drivers and a global data bus shown in FIG. 6.

In transferring the data of a memory block through the global data bus, data of one bit is transferred per bit operation unit. FIG. 9 shows a construction of a portion transferring the one-bit data through the global data bus.

In FIG. 9, bit operation unit PE is provided with sense amplifiers/write drivers SWL0 and SWL1 at one side thereof, and sense amplifiers/write drivers SWR0 and SWR1 at the other side thereof. Sense amplifiers/write drivers SWR0 and SWR1 are coupled to bit line pairs BLPR0 and BLPR1, respectively. Sense amplifiers/write drivers SWL0 and SWL1 are coupled to bit line pairs BLPL0 and BLPL1, respectively. Bit line pair BLP is arranged between bit line pairs BLP0 and BLP1, and is coupled to a sense amplifier/write driver (not shown) in the bank. Likewise, bit line pair BLP is arranged for bit line pairs BLP0 and BLP1, and is coupled to a sense amplifier/write driver (not shown).

Sense amplifiers/write drivers SWL0 and SWL1 are coupled to a global data line GBL through column select gates YGL0 and YGL1 that are selectively turned on in response to column select signals CSL0 and CSL1, respectively. Sense amplifiers/write drivers SWR0 and SWR1 are coupled to global data line GBL through column select gates YGR0 and YGR1 that are selectively turned on in response to column select signals CSR0 and CSR1, respectively. Global data line GBL is a one-bit data transfer line included in global data bus GBS.

In the region where one sense amplifier/write driver band is arranged, therefore, four bit line pairs are arranged per one bit of input/output data. However, only two write drivers and two sense amplifiers are arranged per one bit of the input/output data. Therefore, the alternate arrangement of these sense amplifiers/write drivers can reduce a CPB (Columns Per Bit), i.e., the number of the column lines (bit line pairs) per one bit of input/output data.

Figure 10:
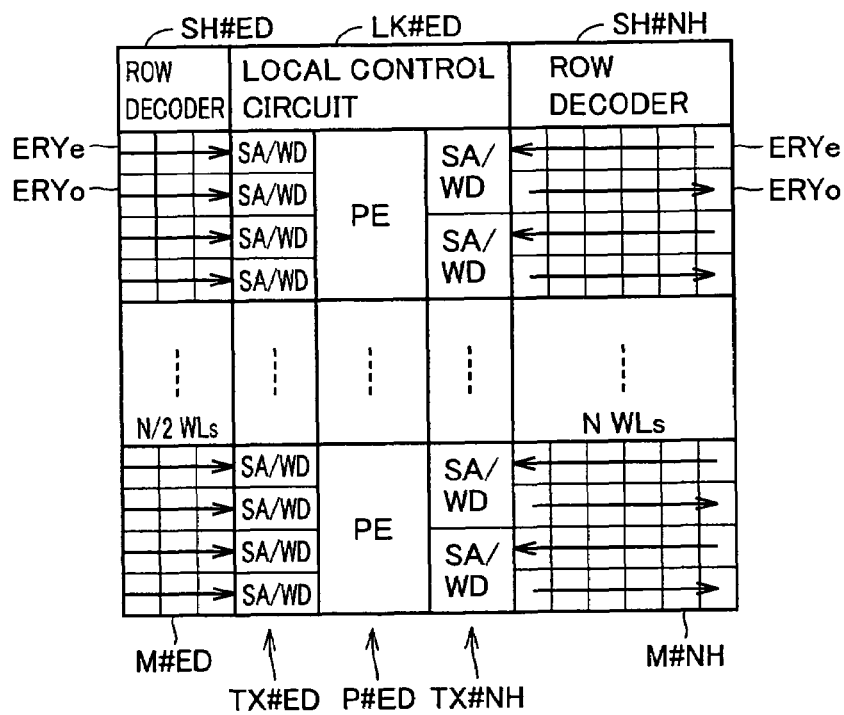
FIG. 10 schematically shows constructions of the memory blocks on the opposite end sides of the memory mat shown in FIG. 4 and circuits related thereto.

FIG. 10 shows a schematic layout of a memory block and associated circuits that are arranged at an end of the memory mat of the parallel operational processing device shown in FIG. 1. In FIG. 10, a memory block M#ED is arranged at the end of one memory mat, and a sense amplifier/write driver band TX#ED is arranged adjacent to memory block M#ED. An operational processing unit P#ED including bit operation units PE are arranged adjacently to sense amplifier/write driver band TX#ED. A sense amplifier/write driver band TX#NH constituting the data transfer circuit is arranged adjacent to operational processing unit P#ED, and a memory block M#NH is arranged adjacent to sense amplifier/write driver band TX#NH.

Memory block M#NH includes N word lines as well as even- and odd-numbered sub-entries ERYe and ERYo that are arranged alternately and are used by different banks, respectively.

In memory block M#ED, word lines WL are provided N/2 in number, i.e., half the number the word lines of memory block M#NH. Even- and odd-numbered sub-entries FRYe and ERYo are both used by the same bank, and are each coupled to a set of sense amplifier SA and write driver WD arranged in sense amplifier/write driver band TX#ED.

In sense amplifier/write driver band TX#ED corresponding to memory block M#ED in the end position, sense amplifier SA and write driver WD are arranged for each sub-entry. In sense amplifier/write driver band TX#NH arranged for memory block M#NH, sense amplifier SA and write driver WD are arranged for each two sub-entries. In operational processing unit P#ED, bit operation unit PE is arranged one per four sub-entries (four memory cell columns).

For memory block M#ED arranged at the memory mat end portion, operational processing unit P#ED is arranged only on its one side. If memory block M#ED at the end portion is configured into the same construction as memory block M#NH, therefore, the bit line pair corresponding to odd-numbered sub-entry is set in non-used state in the construction shown in FIG. 10, and the usage efficiency of the memory cells lowers. Therefore, for the memory block at the end portion of the memory mat, the bit line pairs are all used as the sub-entries or entries in the same bank, and correspondingly, the number of word lines WL is halved.

Figure 11:
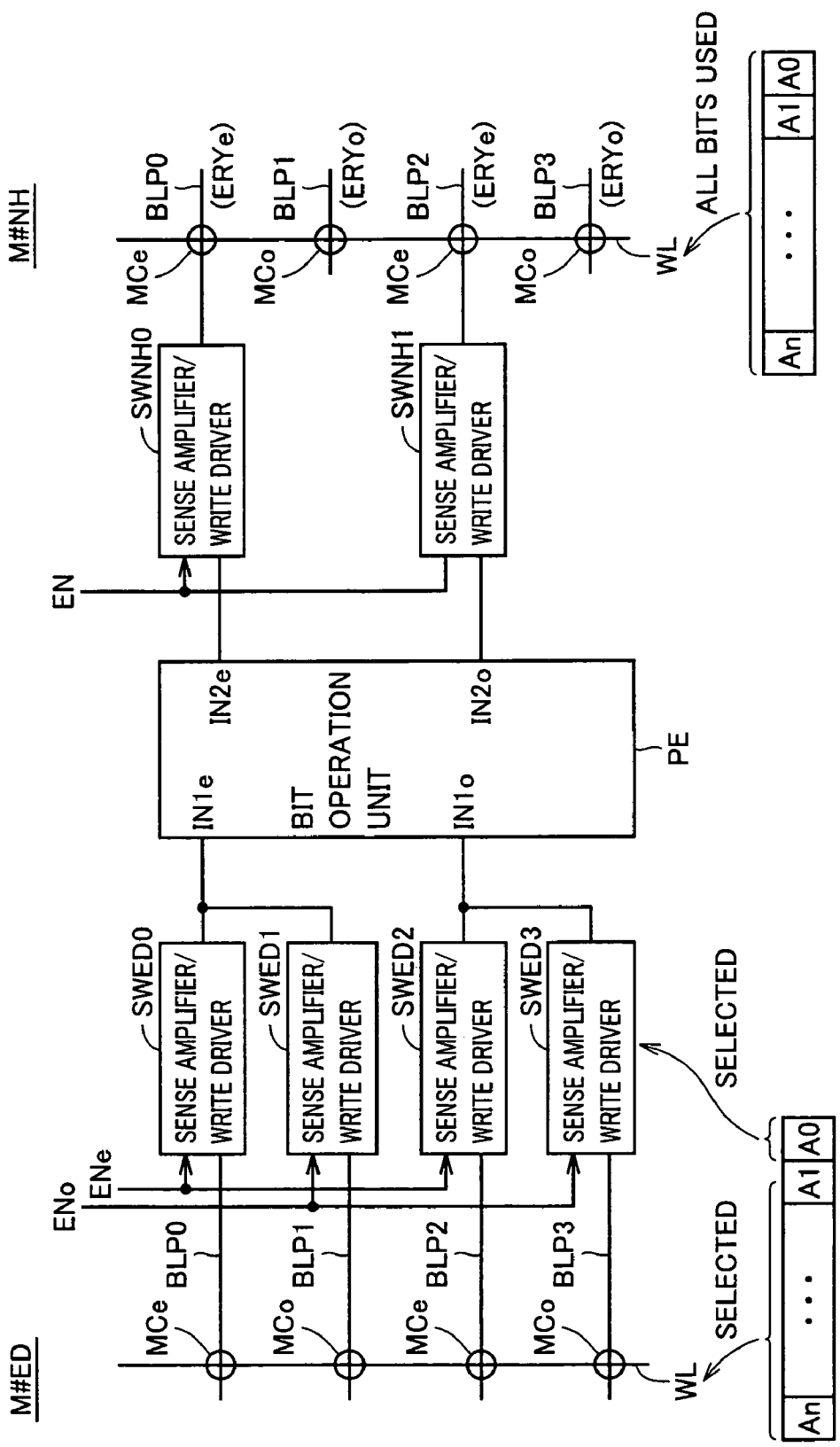
FIG. 11 schematically shows constructions of the bit operation unit and the memory blocks shown in FIG. 10.

FIG. 11 schematically shows a construction of a portion associated with four columns (four bit line pairs) in memory blocks M#ED and M#NH shown in FIG. 10.

Bit line pairs BLP0 to BLP3 are arranged in memory block M#ED. Sense amplifiers/write drivers SWED0 to SWED3 are arranged corresponding to bit line pairs BLP0 to BLP3, respectively. Sense amplifiers/write drivers SWED0 and SWED2 are made active to execute the sensing or writing operation when an activating signal ENe is made active. Sense amplifiers/write drivers SWED1 and SWED3 are made active to execute the sensing or writing operation when an activating signal ENo is made active.

Sense amplifiers/write drivers SWED0 and SWED1 are coupled to a common one-bit input IN1e of bit operation unit PE, and sense amplifiers/write drivers SWED2 and SWED3 are coupled to a common one-bit input IN1o of the bit operation unit PE.

In memory block M#NH, sense amplifiers/write drivers SWNH0 and SWNH1 are arranged for bit line pairs BLP0 and BLP2 among bit line pairs BLP0 to BLP3, respectively. These sense amplifiers/write drivers SWNH0 and SWNH1 perform the sense or write operation when activating signal EN is active. Sense amplifiers/write drivers SWNH0 and SWNH1 are coupled to one-bit inputs IN2e and IN2o of bit operation unit PE, respectively.

In memory block M#ED, memory cells MC (MCe, MCo) 0 are arranged at the respective crossings of word line WL and bit line pairs BLP0 to BLP3. In memory block M#ED, the number of word lines WL is N/2, and a word line WL is selected using word line address bits An to A1 out of word line address bits An to A0. The remaining word line address bit (at the most or least significant bit) A0 is used for selecting activating signals ENe and ENo.

In memory block M#NH, memory cells MC (MCe and MCo) are arranged at the respective crossing portions of word line WL and the bit line pairs. In memory block M#EH, the address designation for word line WL is performed using all word line address bits An to A0.

In selecting a word line WL in memory block M#ED in the construction shown in FIG. 11, when the word line address An to A0 designates an even-numbered address, activating signal (e.g., ENe) is made active, and the data is read or written from or into memory cells MCe on bit line pairs BLP0 and BLP2. When the address An to A0 of the selected word line WL is an odd-numbered address, activating signal ENo is made active, and data is read or written from or into memory cells MCo on bit line pairs BLP1 and BLP3.

In memory block M#NH, when word line WL is selected, bit line pairs BLP0 and BLP2 are even-numbered sub-entries ERYe, and the data are written or read into or from memory cells MCe. Bit line pairs BLP1 and BLP3 are odd-numbered sub-entries ERYo, and are used by another bank (not shown).

In the construction of the operational processing unit (bit operation units) being arranged only on one side of memory block M#ED at the end portion of the memory mat, the number of word lines WL in the end memory block is set half times of the number of word line in another memory block. However, the number of the bit line pairs used is doubled, so that the memory cells used therein is made equal to that in another memory block. When bit line pairs BLP are provided M in number, memory block M#ED includes (N/2)×M memory cells MC, and memory block M#NH includes (N/2)×M memory cells. Therefore, the memory cells arranged in memory block M#ED for storing data to be subjected to an operational processing by operational processing unit P#ED shown in FIG. 10 are equal in number to the memory cells arranged in memory block M#NH.

Since bit line pairs BLP1 and BLP3 are used in the end portion memory block M#ED, the memory cells can be efficiently used in the end portion memory block M#ED, and the layout area of the memory mat can be reduced.

For memory block M#ED at the end portion of the memory mat, sense amplifiers/write drivers SWED (SWED0 to SWED3) are required to provided corresponding to the respective bit line pairs, and the pitch conditions of the sense amplifiers/write drivers become tighter than for the other memory blocks. However, the number of word lines WL is halved in the end portion memory block M#ED, so that a margin of area is secured in the bit line extending direction. Accordingly, by arranging sense amplifiers/write drivers to be aligned in two lines, or to be alternately displaced s in the column direction (bit line extending direction) into a zigzag fashion, the pitch conditions of the sense amplifiers/write drivers are the same as tin the other memory blocks, and the restrictions on the pitch conditions of the sense amplifiers/write drivers can be eliminated.

In memory block M#ED, column select gates are arranged for the respective bit line pairs. When data is transferred with a global data bus, address bit A0 is used for column selection in memory block M#ED. Even when CPB in the end portion memory lock M#ED is twice as large as CPBs in the other memory blocks, the column selection can be accurately executed to execute the input/output of data.

This construction can be achieved by the following construction. In the SRAM peripheral circuits, word line address bit A0 is degenerated for the row decoder of the end portion memory block, while all word line address bits An to A0 are made valid for the row decoders of the other memory blocks. The bit line address bits and the address bit A0 are supplied to the column decoders of all the memory blocks, and address bit A0 is made valid for the column decoder for the end portion memory block and is set into a degenerated state for the other memory blocks. Thus, while the SRAM peripheral circuits are configured into the same construction in all the memory blocks, the number of word lines is halved and CPB is doubled for the end portion memory block.

According to the first embodiment of the invention, the memory blocks and the operational processing units are arranged alternately to each other, and one memory block is shared by the operational processing units on the opposite sides of the memory block. Therefore, an SRAM array boundary region is not present, and a layout area of the memory mats can be reduced.

Since the operational processing unit and the circuit for controlling the data transfer of each memory block are arranged in the central region between the two memory mats, the two memory mats can share the peripheral circuits such as the circuit portions for generating the internal control timing signals, and the layout area of the peripheral circuits can be reduced.

By using the construction in which one memory block is shared by the operational processing units on the opposite sides thereof, data can be transferred to the operational processing units on the opposite sides when one memory block is selected. In the arrangement where the operational processing units on the opposite sides of the memory block are components of different banks, respectively, data transfer can be performed with the two banks when one word line is selected, so that the number of word line selecting operations can be reduced, and accordingly, the power consumption can be reduced.

Second Embodiment

Figure 12:
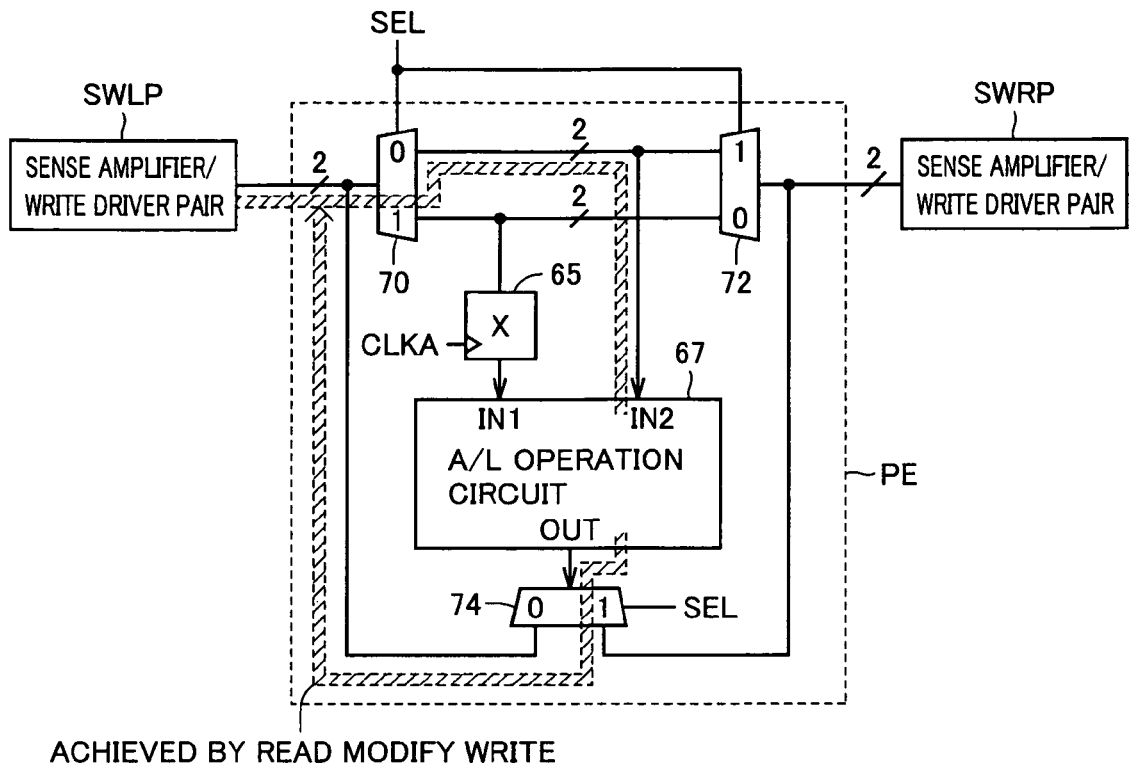
FIG. 12 schematically shows an example of a construction of a bit operation unit according to a second embodiment of the invention.

FIG. 12 schematically shows, by way of example, a construction of the internal connection of bit operation unit PE used in the second embodiment of the invention. In FIG. 12, bit operation unit PE includes a multiplexer 70 that couples a sense amplifier/write driver pair SWLP to one of X-register 65 and two-bit input IN2 of arithmetic/logic operation circuit 67, a multiplexer 72 that couples sense amplifier/write driver pair SWRP of the other memory block to one of two-bit input IN2 of arithmetic/logic operation circuit 67 and X-register 65, and a multiplexer 74 that couples output OUT of arithmetic/logic operation circuit 67 to one of sense amplifier/write driver pairs SWLP and SWRP.

X-register 65 includes X-registers 65a and 65b shown in FIG. 8, and takes in a received applied signal and transmit thus taken signal to input IN1 of arithmetic/logic operation circuit 67 in accordance with a clock signal CLKA.

Each of sense amplifier/write driver pairs SWLP and SWRP includes two sense amplifiers and two write drivers, and transfers data of two bits.

Multiplexer 70 couples sense amplifier/write driver pair SWLP to input IN2 of arithmetic/logic operation circuit 67 when a select signal SEL is "0", and couples sense amplifier/write driver pair SWLP to X-register 65 when select signal SEL is "1".

Multiplexer 72 couples sense amplifier/write driver pair SWRP to input IN2 of arithmetic/logic operation circuit 67 when select signal SEL is "1", and couples sense amplifier/write driver pair SWRP to X-register 65 when select signal SEL is "0".

Multiplexer 74 couples output OUT of arithmetic/logic operation circuit 67 to sense amplifier/write driver pair SWRP when select signal SEL is "1", and couples output OUT of arithmetic/logic operation circuit 67 to sense amplifier/write driver pair SWLP when select signal SEL is "0".

Select signal SEL can specify a memory block to be subjected to data writing. Select signal SEL is produced by a corresponding local control circuit. By way of example, to which memory block an operation result data is written is determined the use of a priority encoder and the data is written into the memory block storing data of a lower priority. For example, when coefficient data and operation data are to be stored in a filtering processing, the memory block storing the coefficient data is handled as the memory block of a higher priority, and the operation result data is stored in the memory block storing the operation data.

With the construction of bit operation unit PE shown in FIG. 12, an operational processing can be performed by reading the data to inputs IN1 and IN2 from the two memory blocks on the opposite sides. X-register 65 takes in the applied data, and then outputs it at the rising of clock signal CLKA in the next clock cycle. In the case of transferring the data to arithmetic/logic operation circuit 67 via X-register 65, the data is required to be read (loaded) into X-register 65 in the cycle preceding the operational processing thereon in arithmetic/logic operation circuit 67.

Figure 13:
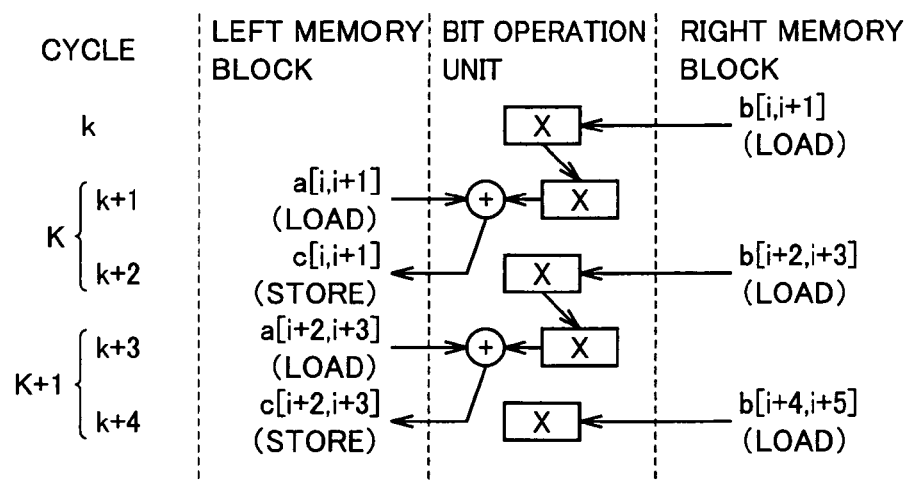
FIG. 13 shows an example of a sequence of a data operation in a bit operation unit shown in FIG. 12.

FIG. 13 shows an example of a normal operation sequence in the case of using the bit operation unit shown in FIG. 12. FIG. 13 shows the sequence for the case of performing a binary addition operation. Clock signal CLKA to bit operation unit PE determines the clock cycle of the operation.

In a clock cycle k, two-bit data or data bits b[i, i+1] are read (loaded) from the right memory block. This data is transferred to X-register 65.

In a next clock cycle k+1, data bits a[i, i+1] are read from the left memory block. In this cycle, the output bits of X-register 65 are in a definite state, and the binary addition is performed on these data bits.

In a next clock cycle k+2, an operation result c[i, i+1] is transferred to and stored in the left memory block. In clock cycle k+2, two-bit data b[i+2, i+3] is read out in the right memory block, and is transferred to X-register 65.

In a clock cycle k+3, two-bit data a[i+2, i+3] is read and the binary addition thereof is performed. In a clock cycle k+4, the operation result c[i+2, i+3] is transferred to and stored in the left memory block. In clock cycle k+4, next data bits b[i+4, i+5] are read out in the right memory block, and are transferred to X-register 65.

According to the operation sequence illustrated in FIG. 13, when the data is to be written into the left memory block, the data reading operations are performed on the right memory block. For achieving these operations, the local control circuit requires circuits for individually controlling the sense amplifiers and write drivers provided for these memory blocks, which complicates the circuit construction, and may increase the circuit layout area.

Accordingly, the data reading and writing performed in clock cycles k+1 and k+2 are combined into an operation to be executed in one clock cycle K. According to such scheme, data can be read out at the same timing in the left and right memory blocks. Likewise, the writing and reading are performed, combining clock cycles k+3 and k+4 into one clock cycle K+1.

For performing the reading and writing in one clock cycle, so-called read modify write is performed as shown in FIG. 12, and the reading of the processing data and the writing of the processed data are executed at the same word line address.

Figure 14:
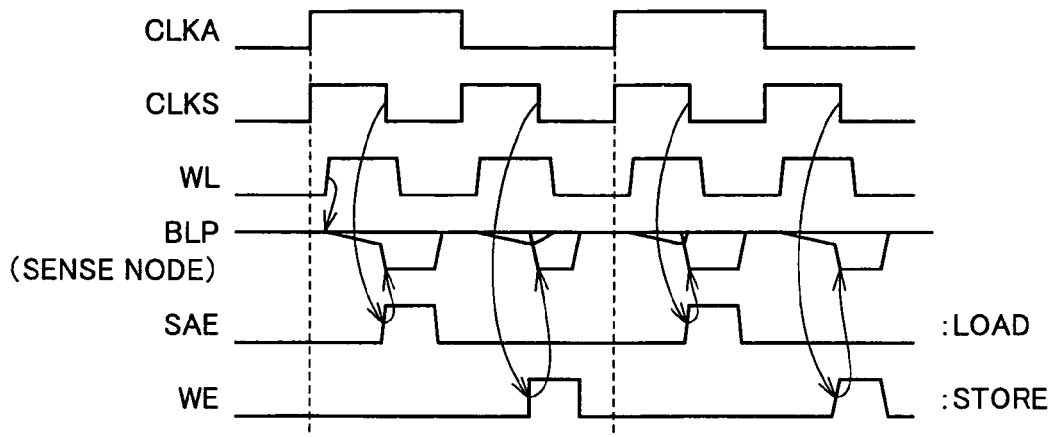
FIG. 14 shows, by way of example, signal waveforms of internal operations for read modify write shown in FIG. 13.

FIG. 14 is a signal waveform diagram representing the operation timings in performing the read modify write with load/store instruction. Clock signal CLKA defines the operation cycle of bit operation unit PE, and a clock signal CLKS defines the operation cycle of the memory block.

As represented in FIG. 14, according to the rising of memory clock signal CLKS, word line WL is driven to the selected state and the memory cell data is read onto bit line pair BLP. Then, a sense amplifier activating signal SAE becomes active in synchronization with the falling of memory clock signal CLKS, and the potentials on bit line pair BLP (sense nodes) are differentially amplified. This sense operation completes the reading of data to the bit operation unit. After the reading, word line WL is temporarily driven to the unselected state.

In FIG. 14, the potentials of bit line pair BLP full-swings in the sensing operation. This is because the sense amplifier is a cross-coupled sense amplifier, and differentially amplifies and latches the bit line potentials. In the case where the sense amplifier is a charge confining type sense amplifier and the sense nodes are isolated from the bit lines in the sensing operation, the bit line attains the potential level corresponding to the potential read from the memory cell. Although the potential changing waveform of the bit line depends on the construction of the sense amplifier, FIG. 14 shows, for emphasizing the sensing operation of the bit lines, that the bit line potentials full-swing in the sensing operation.

When memory clock signal CLKS rises in synchronization with the falling of clock signal CLKA, word line WL is driven to the selected state again, and the memory cell data is read again onto bit line pair BLP. Then, write driver enable signal WE is activated in synchronization with the falling of clock signal CLKS, and the processing operation result data of the bit operation unit is transferred onto bit line pair BLP through the write driver to execute the writing of the operation result data.

When the writing is completed, word line WL is driven to the unselected state, and the read modify write operation is completed.

Therefore, in the case where only a load/store instruction is used, memory clock signal CLKS is toggled twice within one cycle period of clock signal CLKA for the bit operation unit. Thereby, the read modify write can be equivalently achieved, using only the load/store instruction.

In this case, however, the operation frequency of the memory block is twice as high as that of the bit operation unit, resulting in large power consumption. The operation cycle of the memory block may determine the cycle period of time of the bit operation unit, so that the fast operation may be impossible.

Why one of the operation data of binary terms is stored in the X-register and an arithmetic/logic operation is executed in the next cycle is as follows. The data are read concurrently from the memory blocks on the opposite sides, and the arithmetic/logic operation circuit executes an processing operation while bypassing the X-register. In this case, the data reaching the arithmetic/logic operation circuit are definite at the timing delayed due to skew between the data, and accordingly the operation result data is made definite at a delayed timing. Conversely, when the operation data is stored in the X-register, one of the operation data pieces is in the definite state in the next cycle. The skew of the operation data is only the skew the other operation data read in the current operation cycle relative to the clock signal, and the variation in definition timing of the operation data can be suppressed, so that the operation result data is made definite at a faster timing, and the operation cycle period of time can be reduced. Accordingly, the operation is executed using the X-register, without bypassing the X-register.

For achieving the read modify write at high speed with low power consumption, a read modify write instruction is newly prepared in addition to the load/store instruction.

Figure 15:
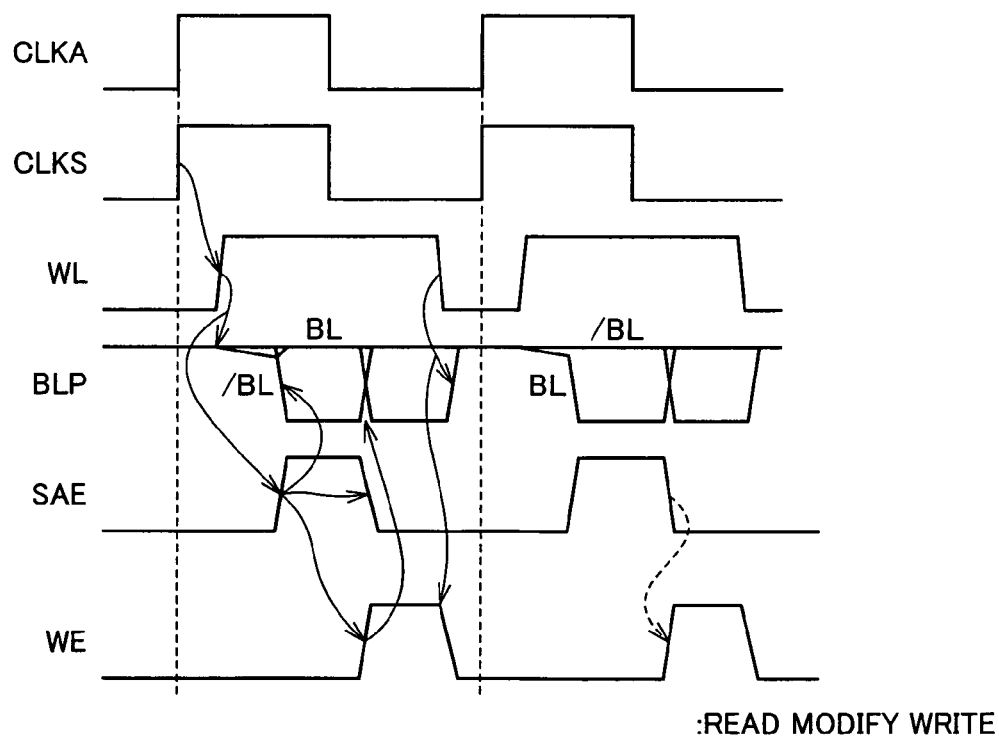
FIG. 15 is a signal waveform diagram representing operations in read modify write according to the second embodiment of the invention.

FIG. 15 is a signal waveform diagram representing an operation in execution of the read modify write instruction. As shown in FIG. 15, clock signal CLKA for an arithmetic/logic operation and memory clock signal CLKS for access change with the same phase at the same frequency. In the read modify write operation, therefore, one clock cycle period of the bit operation unit is the same as one cycle period of the memory block.

Word line WL is driven to the selected state according to the rising of memory clock signal CLKS. Accordingly, a potential difference corresponding to the memory cell data appears between bit lines BL and /BL of bit line pair BLP. Then, sense amplifier activating signal SAE becomes active asynchronously with clock signal CLKS, and the memory cell data read onto bit line pair BLP is read out (i.e., sensed, amplified and transferred).

Then, with the word line kept at the selected state, write driver enable signal WE is made active to transfer and write the data supplied from the bit operation unit onto bit line pair BLP. After the completion of this writing, word line WL is driven to the deselected state. Sense amplifier activating signal SAE and write driver activating signal WE are both activated and deactivated asynchronously with clock signal CLKS. Thereby, the read operation (activation of the sense amplifier) and the write operation (activation of the write driver) can be sequentially performed within one cycle of memory clock signal CLKS while maintaining the word line WL in the selected state.

Subsequently to the activation of sense amplifier activating signal SAE, write driver enable signal WE is made active. As represented by broken line in FIG. 15, write driver enable signal WE may be made active in response to deactivation of sense amplifier activating signal SAE. This timing relationship is appropriately determined according to the circuit construction of the sense amplifier.

After the write driver completes the data writing, the word line is driven to the unselected state. The drive timing of the word line to the deselected state can be determined similarly to the deselection timing of the word line in the normal execution of load or store instruction.

According to the operation waveform diagram of FIG. 15, the operation frequency of the memory block can be set equal to that of clock signal CLKA of the bit operation unit, and the fast operation of the memory block can be easily achieved (i.e., the operation speeds of the memory block and the bit operation unit can be equal to each other).

Word line WL is activated and deactivated only one time in one cycle of clock signal CLKA, so that the number of times of the word line selection and the number of times of the bit line precharging can be reduced to half times as compared with the construction shown in FIG. 14, and the power consumption can be reduced.

Figure 16:
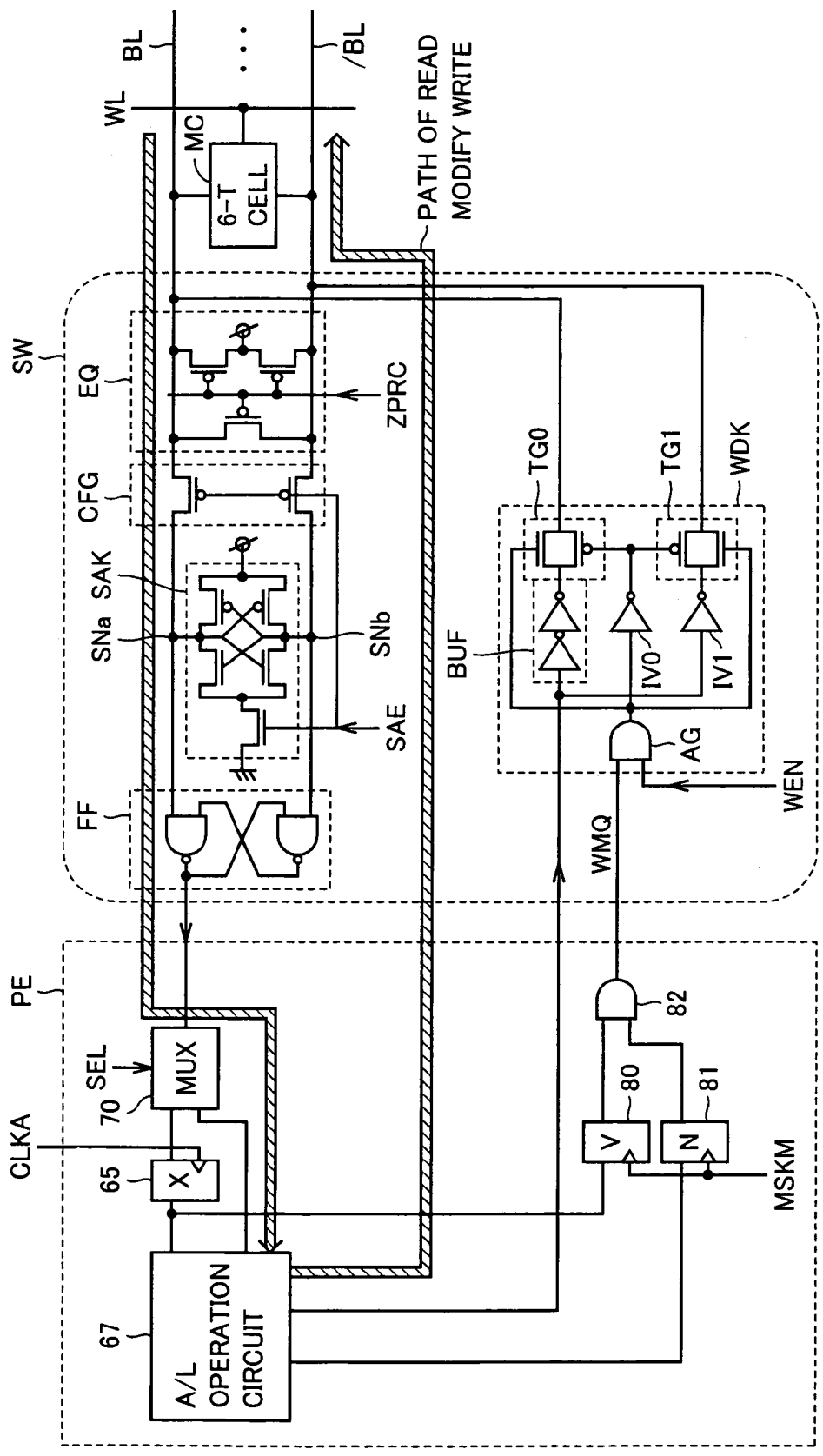
FIG. 16 shows an example of a specific construction of a sense amplifier/write driver and a bit operation unit according to the second embodiment of the invention.

FIG. 16 specifically shows a path for performing the read modify write on the memory block on the right side, together with a construction of a sense amplifier/write driver circuit SW.

In the right memory block, memory cell MC is arranged at each crossing between word line WL and bit lines BL and /BL. This memory cell MC is an SRAM cell, and has a full CMOS construction formed by six transistors (T).

In FIG. 16, sense amplifier/write driver circuit SW includes a bit line precharge/equalize circuit EQ that precharges bit lines BL and /BL to the power supply voltage level when a precharge instructing signal ZPRC is active, a cross-coupled sense amplifier circuit SAK that differentially amplifies and latches signal potentials on sense nodes SNa and SNb when sense amplifier activating signal SAE is active, a charge confining gate CFG that isolates sense nodes SNa and SNb from bit lines BL and /BL, a NAND type flip-flop FF that latches signals on sense nodes SNa and SNb, and transfers them to bit operation unit PE, and a write drive circuit WDK that writes the operation result data received from bit operation unit PE onto bit lines BL and /BL according to a write instructing signal WEN and a write mask instructing signal WMQ.

Bit line precharge/equalize circuit EQ is formed by P-channel MOS transistors (insulated gate field effect transistors), which are turned on to precharge and equalize bit lines BL and /BL to the power supply potential when precharge instructing signal ZPRC is active at the L level (logical low level).

Sense amplifier circuit SAK includes cross-coupled P-channel MOS transistors and cross-coupled N-channel MOS transistors. When sense amplifier circuit SAK is active, it drives the potential of a higher level sense node and the potential of the lower-level sense node to the power supply voltage level and the ground voltage level, respectively, and latches the driven potentials. NAND type flip-flop FF transfers the data sensed and amplified by sense amplifier circuit SAK in one direction to bit operation unit PE.

Write drive circuit WDK includes an AND gate AG receiving a write mask signal WMQ applied from bit operation unit PE and a write enable signal WE, an inverter IV0 inverting an output signal of AND gate AG, a buffer circuit BUF receiving the output of bit operation unit PE, an inverter IV1 receiving an operation result data from bit operation unit PE, and transmission gates TG0 and TG1 that are selectively turned on according to the output signals of AND gate AG and inverter IV0, to transfer the output signals of buffer circuit BUF and inverter IV1 to bit lines BL and /BL, respectively.

Bit operation unit PE includes a multiplexer (MUX: selector) 70 that transfers an output signal of flip-flop FF to X-register 65 and one of the inputs of arithmetic/logic operation circuit 67 according to select signal SEL, and further includes a V-register 80 and an N-register 81 that take in and latch the data supplied from X-register 65 and arithmetic/logic operation circuit 67 according to a write mask setting instructing signal MSKM.

In a normal operational processing, N-register 81 stores numeric data such as a constant. When both the data stored in registers 80 and 81 are set to "1", AND gate AG in write drive circuit WDK operates as a buffer circuit. Otherwise or when write mask instructing signal WMQ is at the L level, write drive circuit WDK is set to the inactive state (output high-impedance state), and the writing of the data supplied from bit operation unit PE into the memory block is prohibited.

In the read modify write operation, a memory block (not shown) on the left side supplies the data bits to X-register 65, and the data of the right memory block is transferred through multiplexer (MUX) 70 to arithmetic/logic operation circuit 67 while bypassing the X-register.

The read modify write mode is designated by setting both the read enable signal instructing the reading and the write enable signal instructing the writing to the active state.

In the standby state, precharge instructing signal ZPRC is at the L level, and bit line precharge/equalize circuit EQ becomes active to precharge and equalize bit lines BL and /BL to the power supply voltage level by the P-channel MOS transistors therein. In this state, sense amplifier activating signal SAE is inactive, and sense amplifier circuit SAK is inactive. Further, charge confining gate CFG is conductive, and sense nodes SNa and SNb are coupled to bit lines BL and /BL, respectively. Flip-flop FF have both its inputs held at the power supply voltage level, and maintains the previous state.

When the read modify write cycle starts, the bit line precharge instructing signal ZPRC first rises to the H level so that bit line precharge/equalize circuit EQ becomes inactive, and bit lines BL and /BL enter the floating state at the power supply voltage level. Then, word line WL is driven to the selected state, and the storage data of memory cell MC is read onto bit lines BL and /BL (a potential difference occurs between bit lines BL and /BL). The potential difference between bit lines BL and /BL is transmitted to sense nodes SNa and SNb. Sense amplifier activating signal SAE is made active at such a timing that the potential difference between sense nodes SNa and SNb is sufficiently developed. Responsively, charge confining gate CFG is turned off to isolate sense nodes SNa and SNb from bit lines BL and /BL. Sense amplifier circuit SAK differentially amplifies and latches the potential difference between sense nodes SNa and SNb. When the potentials of sense nodes SNa and SNb are set to the levels of the power supply voltage and the ground voltage according to the read data, the output signal of flip-flop FF attains the corresponding state.

The output signal of flip-flop FF is applied to arithmetic/logic operation circuit 67 via multiplexer 70, and arithmetic/logic operation circuit 67 executes an arithmetic/logic operation. Then, write driver enable signal WEN is activated while maintaining word line WL in the selected state. When write mask instructing signal WMQ is at the H level, the output signal of AND gate AG attains the H level to turn on transmission gates TG0 and TG1. Complementary data applied from buffer circuit BUF and inverter IV1 are transmitted onto bit lines BL and /BL through transmission gates TG0 and TG1, and are written into memory cell MC connected to the selected word line WL. Then, the read modify write operation completes. After the completion of the read modify write operation, word line WL is driven to the unselected state, sense amplifier activating signal SAE is made inactive and then bit line precharge instructing signal ZPRC is driven to the L level.

In the left memory block from which data is to be read, the data writing is not performed, and write driver enable signal WEN is held in the inactive state. The data reading is performed similarly to the right memory block according to the activation of sense amplifier activating signal SAE. In the left memory block, the driving of word line WL to the inactive state may be performed at the same timing as in the right memory block, or may be performed according to the deactivation of sense amplifier activating signal SAE.

Figure 17:
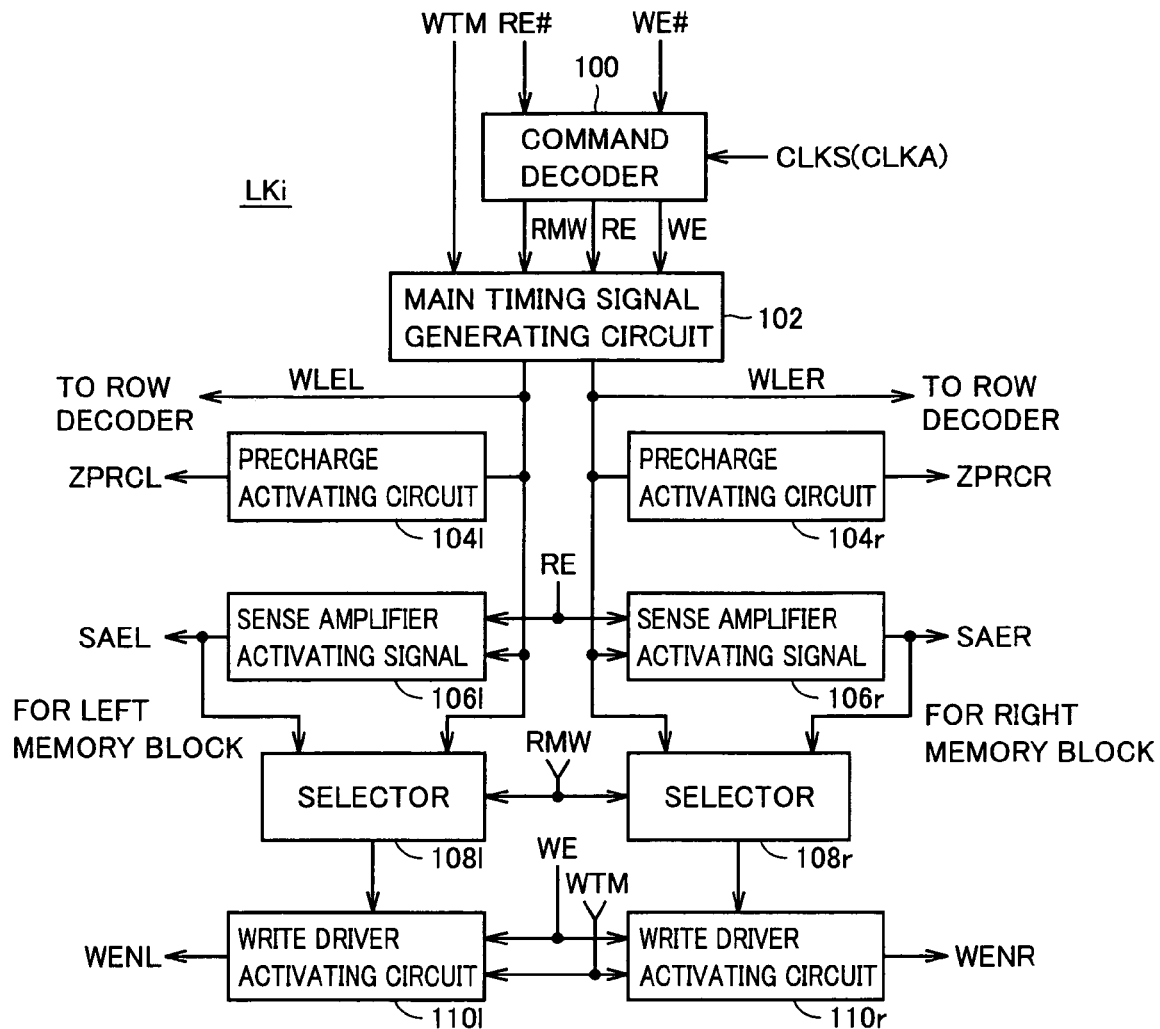
FIG. 17 schematically shows a construction of a local control circuit according to the second embodiment of the invention.

FIG. 17 schematically shows an example of a construction of a local control circuit LKi. In FIG. 17, local control circuit LKi includes a command decoder 100 that decodes operation mode instructions RE# and WE# applied externally according to clock signal CLKS (or CLKA), thereby producing internal operation mode instructing signals RMW, RE and WE instructing designated operation modes, and a main timing signal generating circuit 102 producing word line enable signals WLER and WLEL for a corresponding memory block according to the internal operation instructing signals applied from command decoder 100 and write target memory block specifying signal WTM.

Internal operation mode instructing signal RMW applied from command decoder 100 is a signal designating the read modify write mode, internal operation mode instructing signal RE instructs the operation mode for reading data, and the internal operation mode instructing signal WE instructs the write mode for writing data.

Main timing signal generating circuit 102 drives and maintains word line enable signals WLER and WLEL to and at the active state for a predetermined period of time when read modify write mode instructing signal RMW, read mode instructing signal RE or write mode instructing signal WE is active. Word line enable signals WLER and WLEL are applied to the row decoders of the adjacent memory blocks, respectively. The row decoders of the adjacent memory blocks perform the row selection according to address pointers applied from address pointer registers (not shown) in the local control circuits. Different banks share one memory block, and the row decoder may perform the row selection (word line selection) according to the word line enable signals applied from the local control circuits on the opposite sides thereof, or may perform the row select operation under the control according to the word line enable signal applied from one of the local control circuits (in this case, all the banks operate in parallel in one memory mat).

The following configuration may be employed. When data write mode instructing signal WE is made active, write target memory block specifying signal WTM is made active and the operation of writing data in only one memory block is designated, among the SRAM peripheral circuits, only the row decoder included in the SRAM peripheral circuit provided for the write target memory block performs the row selection, and the other row decoders are kept inactive.

Local control circuit LKi further includes precharge activating circuits 104*l* and 104*r* that drives bit line precharge instructing signals ZPRCL and ZPRCR to the inactive state according to the activation of word line enable signals WLEL and WLER, respectively, and sense amplifier activating circuits 106*l* and 106*r* that activate sense amplifier activating signals SAEL and SAER at a predetermined timing in response to the activation of word line enable signals WLEL and WLER, respectively, when read mode instructing signal RE is active.

Each of the suffixes r, l, R and L in the reference characters and numerals indicates the circuit and signal for the left and right memory blocks.

Read mode instructing signal RE and write mode instructing signal WE is made active when read modify write mode instructing signal RMW is active.

Local control circuit LKi further includes a selector 108*l* that selects one of word line enable signal WLEL and sense amplifier activating signal SAEL according read modify write mode instructing signal RMW, a selector 108*r* that selects one of word line enable signal WLER and sense amplifier activating signal SAER according to read modify write mode instructing signal RMW, a write driver activating circuit 110*l* that activates a write driver activating signal WENL according to the output signal of selector 108*l*, write mode instructing signal WE and write target memory block specifying signal WTM, and a write driver activating circuit 110*r* that activates write driver activating signal WENR according to the output signal of selector 108r, write mode instructing signal WE and write target memory block specifying signal WTM.

When read modify write mode instructing signal RMW is active, selector 108r selects sense amplifier activating signal SAEL provided from sense amplifier activating circuit 106l. Otherwise, it selects word line enable signal WLEL. Selector 108r selects sense amplifier activating signal SAER when read modify write mode instructing signal RMW is active, and otherwise, selects word line enable signal WLER.

Sense amplifier activating circuits 106r and 106l may be configured to activate sense amplifier activating signals SAER and SAEL in synchronization with the falling of the clock signal in the normal data read mode, respectively, and to activate sense amplifier activating signals SAER and SAEL according to the activation of word line enable signals WLER and WLEL in the read modify write operation, respectively. Alternatively, sense amplifier activating circuits 106r and 106l may be configured to activate the sense amplifier activating signals at the same timing in both the normal data read mode (during execution of the load instruction) and the read modify write operation.

As for write driver activating circuits 110l or 110r, since write mode instructing signal WE becomes active in the read modify write mode, the write driver activating circuit for the write target memory block becomes active to activate write driver activating signal WENL or WENR.

Write driver activating circuits 108r and 108l may be configured to activate write driver activating signals WENR and WENL in synchronization with the falling of the clock signal in the normal data write mode (during execution of the store instruction).

With the construction described above, in the read modify write mode, write driver activating circuit 110l or 110r activates write driver activating signal WENL or WENR according to and after elapse of a predetermined time from the activation of sense amplifier activating signal SAEL or SAER, and the reading and writing of the data is executed asynchronously with the clock signal in the read modify operation. Accordingly, the reading and writing of data can be executed in one clock cycle of memory clock signal CLKS (although the operation is in the read modify write mode, and the reading and writing of data is executed to the same address).

Local control circuit LKi shown in FIG. 17 may be configured such that sense amplifier activating circuits 106l and 106r as well as write driver activating circuits 101l and 101r activate sense amplifier activating signals SAEL and SAER or write driver enable signals WENL and WENR in synchronization with clock signal CLKS and in accordance with read mode instructing signal RE, write mode instructing signal WE and memory clock signal CLKS when read modify write mode instructing signal RMW is inactive. For this configuration, the following construction can be employed. Sense amplifier activating circuits 106r and 106l select word line enable signals WLEL and WLER according to the activation/deactivation of read modify write mode instructing signal RMW, and selectors 108r and 108l select sense amplifier activating signals SAER and SAEL or clock signal CLKS according to read modify write mode instructing signal RMW.

Figure 18:
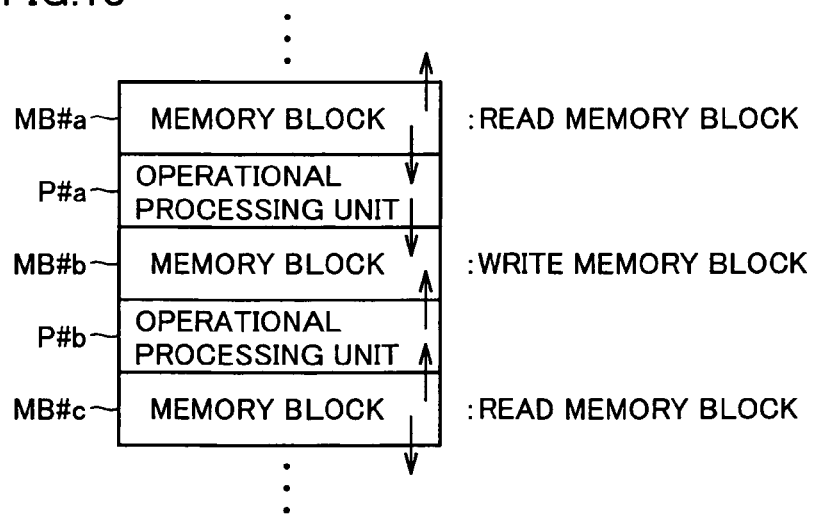
FIG. 18 schematically shows an arrangement of a write target memory block in the second embodiment of the invention.

FIG. 18 illustratively shows an operation state of the memory block in writing in the read modify write mode. In FIG. 18, operational processing units P#a and P#b are arranged between memory blocks MB#a to MB#b. Operational processing units P#a and P#b are used by corresponding banks, and each of memory blocks MB#a to MB#c is shared by adjacent two banks.

Therefore, when the read modify write is performed in operational processing unit P#a and memory block MB#b is selected as the write target memory block, this memory block MB#b is also used as the write target memory block for operational processing unit P#b. Memory block MB#a is used as the data read memory block for operational processing unit P#a, and memory block MB#c is used as the read memory block for reading the data to operational processing unit P#b.

Accordingly, in P#a and P#b, the write target memory block for one operational processing unit is the upper (right) memory block, and the write target memory block for the other operational processing unit is the lower (left) memory block. The positional relationship between the write target memory blocks is sequentially exchanged. This can be readily achieved by merely configuring the logics such that the position of the write target memory block determined according to write target memory block specifying signal WTM is sequentially switched for each operational processing unit or local control circuit (the write target memory block specifying signal is inverted).

According to the second embodiment of the invention, as described above, the read modify write is achieved by such a configuration that the reading and writing of data are performed asynchronously with the memory clock signal. Thereby, the reading and writing of data can be performed while maintaining the word line in the selected state, so that the number of times of the word line selection can be reduced, and the current consumed by the word line selection and the bit line precharging can be reduced. The read modify write can be achieved at the same operation frequency as the clock signal for an arithmetic/logic (processing) operation so that the operation frequency of the memory block can be increased.

The read modify write merely uses the register for each bit operation unit, and does not require an additional circuit element for the read modify write, which suppresses increase in layout area. Further, the operation frequency in the memory block can be halved, and the circuit constants for achieving the fast operation can be reduced so that it is possible to reduce the transistor size, and the area of the peripheral circuits (the SRAM peripheral circuits and the local control circuits) can be reduced.

The combination of the first and second embodiments can achieve the parallel operational processing device that operates fast with low power consumption and a small area and that achieves the effects of the first and second embodiments.

The operational processing unit may be configured such that each column in the SRAM array forms one entry, the ALU is arranged corresponding to each entry and each ALU sequentially processes one-bit data of the corresponding entry.

This invention can be applied to the SIMD type processing device having a memory cell array and an operational processing unit being integrated on the same semiconductor chip. In particular, by applying the invention to a parallel operational processing device that processes a large amount of data, it is possible to achieve an operational processing device that can process a large amount of data at high speed with low power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A parallel operational processing device comprising:
a plurality of memory blocks each including (i) a plurality of memory cells arranged in rows and columns, and (ii) a plurality of bit lines arranged corresponding to the respective memory cell columns;
a plurality of operational processing units, arranged between said plurality of memory blocks, each having a plurality of operation units each for executing a processing operation on received data; and
data transfer circuitry including a plurality of data write/read circuits, arranged alternately on opposite sides of the bit lines in each memory block, each for transferring data with an operational unit of an adjacent operational processing unit, a memory block being shared between adjacent operational processing units.

2. The parallel operational processing device according to claim 1, wherein
said plurality of memory blocks are divided into a plurality of memory mats each including the memory blocks aligned in one direction, and
said parallel operational processing device further comprises local control circuits arranged in a region between the memory mats, for controlling operations of the data transfer circuitry and of the operational processing units.

3. The parallel operational processing device according to claim 1, wherein
each of the memory blocks further includes a plurality of word lines arranged corresponding to the respective memory cell rows,
the data write/read circuits of each data transfer circuit transfer data between corresponding bit lines and corresponding operational units, and
the memory blocks arranged at opposite ends among said plurality of memory blocks each are halved in number of the word lines as compared with other memory block shared by the adjacent operational processing units.

4. The parallel operational processing device according to claim 3, wherein
the data transfer circuitry includes data write/read circuits arranged on first sides of the bit lines of the memory block arranged at each end of the opposite ends, and being coupled to a common, adjacent operational processing unit.

5. The parallel operational processing device according to claim 1, wherein
each of the memory blocks has a plurality of word lines arranged corresponding to the respective memory cell rows; and
said parallel operational processing device further comprises a plurality of local control circuits arranged corresponding to said operational processing units, and controlling operations of corresponding data write/read circuits of the data transfer circuitry and the corresponding operational processing units,
the local control circuit, provided for the data write/read circuits arranged corresponding to a memory block storing a result of processing operation, controlling the corresponding memory block and corresponding data write/read circuits such that the corresponding write/read circuits execute sequentially reading and writing of data with the corresponding operational unit while holding a word line in the corresponding memory block in a selected state in a data accessing cycle.

6. The parallel operational processing device according to claim 5, wherein
the operational processing units have a processing cycle determined by a clock signal, and
the local control circuits each produce and supply a data read activating signal and a data write activating signal to corresponding data write/read circuits for controlling operations of said corresponding data write/read circuits asynchronously with said clock signal, in accordance with an operation mode instructing signal.

* * * * *